(12) United States Patent
Kassab et al.

(10) Patent No.: US 10,955,460 B2
(45) Date of Patent: Mar. 23, 2021

(54) TEST SCHEDULING AND TEST ACCESS IN TEST COMPRESSION ENVIRONMENT

(75) Inventors: Mark Kassab, Wilsonville, OR (US); Grzegorz Mrugalski, Swarzedz (PL); Nilanjan Mukherjee, Wisonville, OR (US); Janusz Rajski, West Linn, OR (US); Jakub Janicki, Poznan (PL); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 1348 days.

(21) Appl. No.: 13/635,683

(22) PCT Filed: Mar. 16, 2011

(86) PCT No.: PCT/US2011/028741
§ 371 (c)(1),
(2), (4) Date: Nov. 8, 2012

(87) PCT Pub. No.: WO2011/116145
PCT Pub. Date: Sep. 22, 2011

(65) Prior Publication Data
US 2015/0285854 A1    Oct. 8, 2015

Related U.S. Application Data

(60) Provisional application No. 61/314,569, filed on Mar. 16, 2010.

(51) Int. Cl.
*G01R 31/28* (2006.01)
*G01R 31/319* (2006.01)
(Continued)

(52) U.S. Cl.
CPC ..... *G01R 31/2834* (2013.01); *G01R 31/2851* (2013.01); *G01R 31/31921* (2013.01);
(Continued)

(58) Field of Classification Search
CPC .......... G01R 31/2834; G01R 31/2851; G01R 31/31921; G01R 31/318335; G01R 31/318547
See application file for complete search history.

(56) References Cited

U.S. PATENT DOCUMENTS 5,978,942 A * 11/1999 Rockoff .......... G01R 31/31907
714/724
6,055,644 A    4/2000 Henkel
(Continued)

OTHER PUBLICATIONS

A.B. Kinsman and N. Nicolici, "Time-Mulitplexed Test Data Decompression Architecture for Core-Based SOCs with Improved Utilization of Tester Channels" Proc. ETS, pp. 196-201, 2005.*
(Continued)

*Primary Examiner* — Lina M Cordero

(57) ABSTRACT

Disclosed are representative embodiments of methods, apparatus, and systems for test scheduling and test access in a test compression environment. Clusters of test patterns for testing a plurality of cores in a circuit are formed based on test information that includes compressed test data, corresponding tester channel requirements and correlated cores. The formation of test pattern clusters is followed by tester channel allocation. A best-fit scheme or a balanced-fit scheme may be employed to generate channel allocation information. A test access circuit for dynamic channel allocation can be designed based on the channel allocation information.

18 Claims, 13 Drawing Sheets

(51) Int. Cl.
  *G01R 31/3185* (2006.01)
  *G01R 31/3183* (2006.01)
(52) U.S. Cl.
  CPC ............. *G01R 31/318335* (2013.01); *G01R 31/318547* (2013.01)

(56) References Cited

U.S. PATENT DOCUMENTS

| | | | | |
|---|---|---|---|---|
| 6,557,128 | B1* | 4/2003 | Turnquist | G01R 31/31908 714/724 |
| 7,853,425 | B1* | 12/2010 | Williamson | G01R 31/31907 324/73.1 |
| 2007/0234169 | A1* | 10/2007 | Rajski | G01R 31/318547 714/742 |
| 2008/0052586 | A1* | 2/2008 | Rajski | G01R 31/318335 714/741 |
| 2010/0213960 | A1* | 8/2010 | Mok | G01R 35/00 324/762.03 |
| 2011/0179325 | A1* | 7/2011 | Gupta | G01R 31/318547 714/727 |
| 2011/0276302 | A1* | 11/2011 | Rivoir | G01R 31/31908 702/117 |

OTHER PUBLICATIONS

Chakrabarty, K., Design of System-on-a-Chip Test Access Architectures using Integer Linear Programming, Duke University, Nov. 2007.*
A.M. Amory, E. Briao, E. Cota, M. Lubaszewski, and F.G. Moraes, "A Scalable Test Strategy for Network-on-Chip Routers," Proc. ITC, paper 25.1, 2005.
A.M. Amory, K. Goossens, E.J. Marinissen, . M. Lubaszewski, and F. Moraes, "Wrapper Design for the Reuse of Networks-on-Chip as Test Access Mechanism," Proc. ETS, pp. 213-218, 2006.
K. Chakrabarty, "Test Scheduling for Core Based Systems Using Mixed-Integer Linear Programming," IEEE Trans. CAD, vol. 19, pp. 1163-1174, Oct. 2000.
K. Chakrabarty, "Optimal Test Access Architectures for System-on-a-Chip," ACM Trans. on Design Automation of Electronic Systems, vol. 6, pp. 26-49, Jan. 2001.
K. Chakrabarty, "A Synthesis-for-Transparency Approach for Hierarchical and System-on-a-Chip Test," IEEE Trans. VLSI, vol. 11, pp. 167-179, Apr. 2003.
K. Chakrabarty, V. Iyengar, and M. D. Krasniewski, "Test Planning for Modular Testing of Hierarchical SOCs," IEEE Trans. CAD, vol. 24, pp. 435-448, Mar. 2005.
R.M. Chou, K.K. Saluja, and V.D. Agrawal, "Scheduling Tests for VLSI Systems Under Power Constraints," IEEE Trans, VLSI, vol. 5, pp. 175-184, Jun. 1997.
Z.S. Ebadi and A. Ivanov, "Design of an Optimal Test Access Architecture Using a Genetic Algorithm," Proc. ATS, pp. 205-210, 2001.
I. Ghosh, S. Dey, and N. JHA, "A Fast and Low Cost Testing Technique for Core-Based System-on-Chip," Proc. DAC, pp. 542-547, 1998.
S.K. K Goel and E.J. Marinissen, "Effective and Efficient Test Architecture Design for SOCs," Proc. ITC, pp. 529-538, 2002.
S.K. Goel E.J. Marinissen, A. Sehgal, and K. Chakrabarty "Testing of SOCs with Hierarchical Cores: Common Fallacies, Test Access Optimization, and Test Scheduling," IEEE Trans. Comput., vol. 58, pp. 409-423, Mar. 2009.
P.T. Gonciari and B.M. Al-Hashimi, "A Compression-Driven Test Access Mechanism Design Approach," Proc. ETS, pp. 100-105, 2004.
Y. Huang, W.-T. Chen, C.C. Tsai, N. Mukherjee, O. Samman, Y. Zaidan, and S.M. Reddy, "Optimal Core Wrapper Width Selection and SOC Test Scheduling Based on 3-D Bin Packing Algorithm," Proc. ITC, pp. 74-82, 2002.

U. Ingelsson, S.K. K Goel, E. Larsson, and E.J. Marinissen, "Test Scheduling for Modular SOCs in an Abort-on-Fail Environment," Proc. ETS, pp. 8-13, 2004.
V. Iyengar and K. Chakrabarty, "System-on-a-Chip Test Scheduling with Precedence Relationships, Preemption, and Power Constraints," IEEE Trans. CAD, vol. 21, pp. 1088-1094, Sep. 2002.
V. Iyengar, K. K Chakrabarty, and E.J. Marinissen, "Test Wrapper and Test Access Mechanism Co-Optimization for System-on-Chip," JETTA, vol. 18, pp. 213-230, Apr. 2002.
V. Iyengar, K. Chakrabarty, and E.J. Marinissen, "Efficient Test Access Mechanism Optimization for System-on-Chip," IEEE Trans. CAD, vol. 22, pp. 635-643, May 2003.
V. Iyengar, K. Chakrabarty, and E.J. Marinissen,"Test Access Mechanism Optimization, Test Scheduling, and Tester Data Volume Reduction for System-on-Chip," IEEE Trans. Comput., vol. 52, pp. 1619-1632, Dec. 2003.
V. Iyengar, A. Chandra, S. Schweizer, and K. Chakrabarty, "A Unified Approach for SOC Testing Using Data Compression and TAM Optimization," Proc. Date, pp. 1188-1189, 2003.
A.B. Kinsman and N. Nicolici, "Time-Multiplexed Test Data Decompression Architecture for Core-Based SOCs with Improved Utilization of Tester Channels," Proc. ETS, pp. 196-201, 2005.
E. Larsson and H. Fujiwara, "Power Constrained Preemptive TAM Scheduling," Proc. ETW, pp. 119-126, 2002.
E. Larsson and H. Fujiwara, "System-on-Chip Test Scheduling with Reconfigurable Core Wrappers," IEEE Trans. VLSI, vol. 14, No. 3, pp. 305-309, Mar. 2006.
E. Larsson and Z. Peng, "An Integrated Framework for the Design and Optimization of SOC Test Solutions," JETTA, vol. 18, pp. 385-400, Aug.-Oct. 2002.
C. Liu, E. Cota, H. Sharif, and D.K. Pradhan, "Test Scheduling for Network-on-Chip with BIST and Precedence Constraints," Proc. ITC, pp. 1369-1378, 2004.
C. Liu, V. Iyengar, and D.K. Pradhan, "Thermal-Aware Testing of Network-on-Chip Using Multiple Clocking," Proc. VTS, pp. 46-51, 2006.
E.J. Marinissen, S.K. Goel, and M. Lousberg, "Wrapper Design for Embedded Core Test," Proc. ITC, pp. 911-920, 2000.
N. Nourani and C. Papachristou, "An ILP Formulation to Optimize Test Access Mechanism in System-on-Chip Testing," Proc. ITC, pp. 902-910, 2000.
J. Rajski, J. Tyszer, M. Kassab, and N. Mukherjee, "Embedded Deterministic Test," IEEE Trans. CAD, vol. 23, pp. 776-792, May 2004.
A. Seghal and K. Chakrabarty, "Efficient Modular Testing of SOCs Using Dual Speed TAM Architectures," Proc. Date, pp. 422-427, Feb. 2004.
A. Seghal, S.K. Goel, E.J. Marinissen, and K. Chakrabarty, "IEEE P1500-Compliant Test Wrapper Design for Hierarchical Cores," Proc. ITC, pp. 1203-1212, 2004.
A. Seghal, S.K. Goel, E.J. Marinissen, and K. Chakrabarty, "Hierarchy-Aware and Area-Efficient Test Infrastructure Design for Core-Based System Chips," Proc, Date, pp. 285-290, 2006.
A. Seghal, V. Iyengar, and K. Chakrabarty, "SOC Test Planning Using Virtual Test Access Architectures," IEEE Trans. VLSI, vol. 12, pp. 1263-1276, Dec. 2004.
K. Stewart and S. Tragoudas, "Interconnect Testing for Network-on-Chips," Proc. VTS, pp. 100-105, 2006.
M. Tehranipoor, M. Nourani, and K. Chakrabarty, "Nine-coded Compression Technique for Testing Embedded Cores in SOCs," IEEE Trans. VLSI, vol. 13, pp. 719-731, Jun. 2005.
N. Touba and B. Pouya, "Testing Embedded Cores Using Partial Isolation Rings," Proc. VTS, pp. 10-16, 1997.
Z. Wang, K. Chakrabarty, and S. Wang, "Integrated LFSR Reseeding, Test-Access Optimization, and Test Scheduling for Core-Based System-on-Chip," IEEE Trans. CAD, vol. 28, pp. 1251-1263, Aug. 2009.
L. Wang, C.E. Stroud, and N.A. Touba (ed.), System-on-Chip Test Architectures, Elsevier, 2007.
Q. Xu and N. Nicolici, "Time/Area Tradeoffs in Testing Hierarchical SOCs with Hard Mega-Cores," Proc. ITC, pp. 1196-1202, 2004.
D. Zhao and S. Upadhyaya, "Power Constrained Test Scheduling with Dynamically Varied TAM," Proc. VTS, pp. 273-278, 2003.

(56) References Cited

OTHER PUBLICATIONS

Z. Zhang, et al., "SoC Testing Using LFSR Reseeding, and Scan Slice-based TAM Optimization and Test Scheduling", Design Automation and Test in Europe, 2007, pp. 1-6.

A. Larsson, et al. "Test-Architecture Optimization and Test Scheduling for SOCs with Core-Level Expansion of Compressed Test Patterns," Design Automation and Test in Europe, 2008, pp. 188-193.

* cited by examiner

TEST SCHEDULING AND TEST ACCESS IN TEST COMPRESSION ENVIRONMENT

RELATED APPLICATIONS

This application claims priority to U.S. Provisional Patent Application No. 61/314,569, entitled "SOC Testing In Test Compression Environment," filed on Mar. 16, 2010, and naming Grzegorz Mrugalski et al. as inventors, which application is incorporated entirely herein by reference.

FIELD OF THE INVENTION

The present invention relates to the field of testing integrated circuits. Various aspects of the invention may be particularly useful for system-on-chip testing in a test compression environment.

BACKGROUND OF THE INVENTION

The electronics industry's aggressive shrinking of chip features below 50 nanometers and moving toward three-dimensional integrated circuits have made a dramatic impact on design and test. Contemporary system-on-chip (SoC) and system-in-package (SiP) designs embed more than a billion transistors running at operating frequencies in the gigahertz range. These designs can include a variety of digital, analog, mixed-signal, memory, optical, micro-electromechanical and radiofrequency circuits. The popularity of SoC circuits has led to an unprecedented increase in the test cost. This cost increase is primarily attributed to the difficulty in accessing embedded cores during test, long test development and test application time, and large volumes of test data involved. Although network-on-chip (NoC) systems can alleviate some of the core communication problems, these structures in turn have further complicated the SoC test procedures.

On-chip test compression has established itself as one of the mainstream DFT (Design-for-testability) methodologies. By using on-chip test decompression and compression hardware, a tester can deliver test patterns in a compressed form, and the on-chip decompression hardware can expand (or decompress) the compressed test patterns into the actual data loaded into scan chains. The latter operation is possible because typically only a small number of bits in the decompressed test patterns are specified bits designed to target one or more specific faults in the integrated circuit. The remaining unspecified bits of the decompressed test pattern are termed "don't care" bits and are typically randomly determined as a result of the decompressor structure. After being captured, the test response data are compressed by the on-chip compression hardware (sometimes referred to as compactor). The compressed test response data are subsequently delivered back to the tester.

The application of compression techniques in SoC designs requires additional on-chip hardware infrastructure, including a test access mechanism (TAM) and test wrappers. Originally, TAMs were used to transport test stimuli from the SoC pins to the embedded cores and test responses from the embedded cores to the SoC pins, while test wrappers formed the interface between the core and the SoC environment. In addition to dedicated TAMs, cost-effective SoC testing typically requires some form of test scheduling. Test scheduling for SoCs usually involves multiple test resources and cores with multiple tests. Unfortunately, even relatively simple test scheduling algorithms typically have NP(nondeterministic polynomial time)-complete problems. This is because test scheduling has been commonly formulated as a combinatorial open shop scheduling problem with a certain number of processors or as two or three-dimensional bin packing. These methods divide given channels into disjoint subsets. Each subset represents a test bus or a processor in the multiprocessor scheduling problem formulation. Different buses have different widths. Testing of cores can then be performed by accessing each core through only one of the test buses. Dedicated routing paths can be used to deliver tests to cores, while the test-scheduling problem is solved by means of integer linear programming.

Performing both TAM optimization and test scheduling can significantly affect the test time, test data volume, and test cost. It is thus desirable to search for integrated methods for test scheduling and test access for SoC testing.

BRIEF SUMMARY OF THE INVENTION

Disclosed are representative embodiments of methods, apparatus, and systems for test scheduling and test access for SoC testing. In a test compression environment, the compressed test data (or compressed test patterns) encode test patterns for testing a plurality of cores in a circuit. The compressed test data may be generated in a way such that numbers of ATE (automatic test equipment) channels required for delivering the compressed test data to a plurality of cores in the circuit under test are small. According to some embodiments of the invention, this can be achieved by deriving solutions that require small numbers of ATE channels for linear equations associated with decompressors for the plurality of cores. It should be noted that different terms may be used for "cores" such as "blocks" and "modules."

Based on the compressed test data and corresponding ATE channel requirements, test pattern clusters (also referred to as base clusters or base classes) are formed. Information about correlated cores may also be used in various situations. Each of the test pattern clusters includes test patterns selected from the plurality of test patterns that can be delivered to the circuit in parallel. With some implementations of the invention, configuration classes of test patterns are formed. A configuration class includes test patterns that have the same descriptor. A descriptor of a test pattern indicates cores that need to be accessed in parallel and the number of ATE channels needed for each of the cores when applying the test pattern. After the configuration classes of test patterns are formed, complementary configuration classes are combined to form test pattern clusters.

The formation of test pattern clusters is followed by allocation of ATE channels. Core distribution histogram information associated with the test pattern clusters may be used. Some embodiments of the disclosed techniques employ a best-fit scheme. Some other embodiments of the disclosed techniques employ a balanced-fit scheme. A test access circuit may be designed based on the ATE channel allocation information. The test access circuit can perform dynamic channel allocation according to the ATE channel allocation information. The number of wires connecting ATE channels and EDT (embedded deterministic test) inputs for the plurality of clusters of cores can be reduced using a simple greedy algorithm.

Experimental results for applying some embodiments of the disclosed techniques are disclosed.

DETAILED DESCRIPTION OF THE INVENTION

General Considerations

Figure 1:
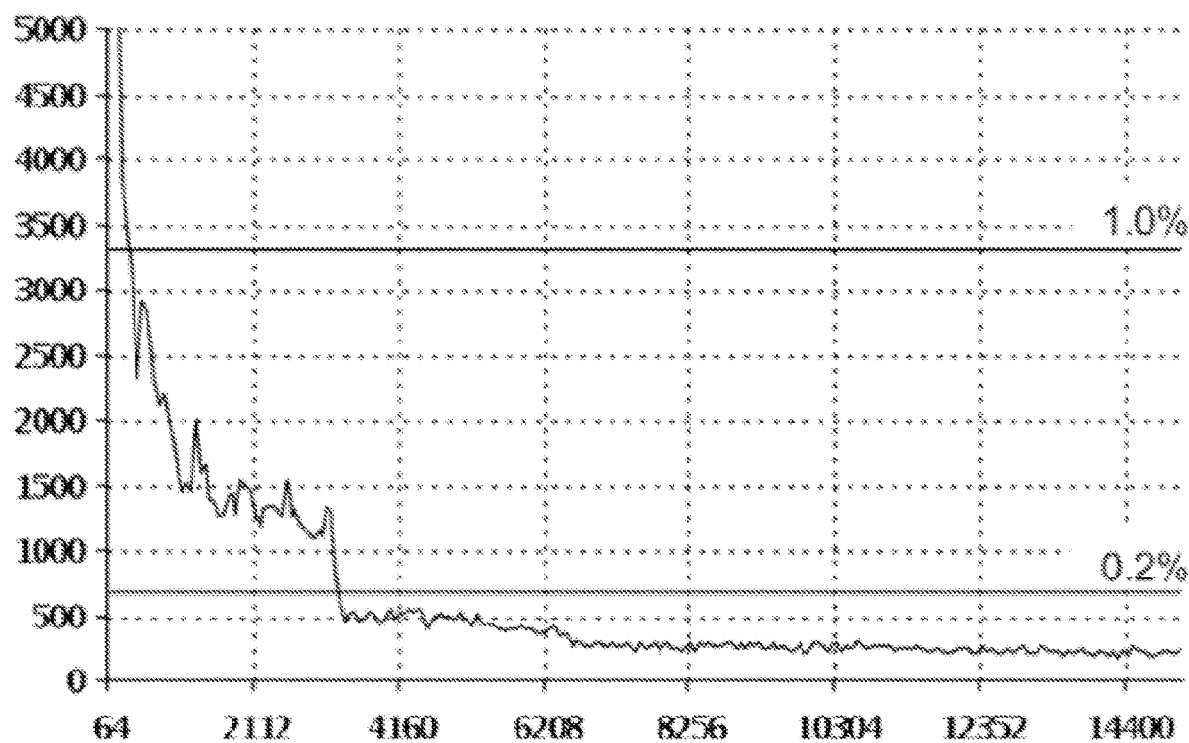
FIG. 1 illustrates a test cube fill rate profile for an industrial design comprising 7M gates and 330K scan cells.

Various aspects of the present invention relate to reducing power consumption during testing integrated circuits. In the following description, numerous details are set forth for the purpose of explanation. However, one of ordinary skill in the art will realize that the invention may be practiced without the use of these specific details. In other instances, well-known features have not been described in details to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "evaluate" and "determine" to describe the disclosed methods. These terms are high-level abstractions of the actual operations that are performed. The actual operations that correspond to these terms may vary depending on the particular implementation and are readily discernible by one of ordinary skill in the art.

Among the disclosed embodiments are test scheduling and test access techniques for SoC. This particular usage, however, should not be construed as limiting, as aspects of the disclosed technology can be used to implement test scheduling and test access techniques in other scan-based or partially-scan-based circuits (for example, systems-in-package (SiPs) application-specific integrated circuits (ASICs) (including mixed-signal ASICs), and programmable logic devices (PLDs), such as field programmable gate arrays (FPGAs)).

As more fully explained below, embodiments of the disclosed technology can be performed or created by computer-executable instructions stored on one or more computer-readable media (e.g., tangible non-transitory computer-readable media such as one or more optical media discs, volatile memory or storage components (such as DRAM or SRAM), or nonvolatile memory or storage components (such as hard drives)) and executed on a computer. Such embodiments can be implemented, for example, as an electronic-design-automation (EDA) software tool (e.g., an automatic test pattern generation (ATPG) tool). The computer-executable instructions can be part of, for example, a dedicated software application or a software application that is accessed or downloaded via a web browser or other software application (such as a remote computing application). Such software can be executed, for example, on a single local computer or in a network environment (e.g., via the Internet, a wide-area network, a local-area network, a client-server network (such as a cloud computing network), or other such network) using one or more network computers. For clarity, only certain selected aspects of the software-based implementations are described. Other details that are well known in the art are omitted. For example, it should be understood that the disclosed technology is not limited to any specific computer language, software tool, or computer. Any of the disclosed methods can alternatively be implemented (partially or completely) in hardware (e.g., an ASIC, PLD, or SoC).

Additionally, any circuit description or design file describing any of the disclosed apparatus or any data structure, data file, intermediate result, or final result created or modified using any of the disclosed methods can be stored on one or more computer-readable storage medium (e.g., tangible non-transitory computer-readable media, such as one or more optical media discs, volatile memory or storage components (such as DRAM or SRAM), or nonvolatile memory or storage components (such as hard drives)).

Furthermore, any of the software-based embodiments (comprising, for example, computer-executable instructions which when executed by a computer cause the computer to perform any of the disclosed methods or to create design data for any of the disclosed apparatus) can be transmitted, received, or accessed through a suitable communication means. For example, a server computer can transmit to a client computer the computer-executable instructions for performing any of the disclosed methods or for creating design data for any of the disclosed apparatus (e.g., after the server receives a request from the client computer to download the computer-exectuable instructions). Similarly, any circuit description, design file, data structure, data file, intermediate result, or final result created or modified using any of the disclosed methods or describing any of the disclosed apparatus can be transmitted, received, or accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means. Such communication means can be, for example, part of a shared or private network.

Additionally, any circuit description, design file, data structure, data file, intermediate result, or final result produced by any of the disclosed methods or describing any of the disclosed apparatus can be displayed to a user using a suitable display device (e.g., a computer monitor, touch screen, or other such display device). Such displaying can be performed as part of a computer-implemented method of performing any of the disclosed methods.

The disclosed methods or apparatus can be used or implemented at one or more stages of an overall design flow. Circuits manufactured using designs created or tested using embodiments of the disclosed technology are also considered to be within the scope of this disclosure. For example, a circuit design describing any of the disclosed testing environments can be fabricated into an integrated circuit using known microlithography techniques.

Any of the disclosed methods or apparatus can be performed or designed in an EDA environment. For presentation purposes, however, the present disclosure sometimes refers to a circuit-under-test (including the various components of the circuit-under-test) and the associated testing hardware (including the various components of the hardware) by their physical counterparts (for example, scan chains, scan cells, output integrator, test access network, and other such terms). It should be understood, however, that any such reference not only includes the physical components but also includes representations of such components stored on non-transitory computer-readable media as are used in simulation, automatic test pattern generation, or other such EDA environments. For example, any of the disclosed apparatus can be described or represented as design data or design information stored on one or more computer-readable media. More specifically, any of the disclosed testing apparatus can be described or represented in an HDL file (such as a Verilog, VHDL, or register-transfer level file), a gate-level netlist, or other such EDA design file (e.g., a GDSII file or Oasis file). Such design data or design information can be created using an appropriate EDA software tool.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Furthermore, as used herein, the term "decompressor" refers to one or more functional units that decompress compressed test stimuli (or compressed test data), such as deterministic test stimuli from external test equipment, for delivery to a circuit-under-test on the chip. A decompressor can be implemented in various forms. Such forms can include, but are not restricted to, broadcast circuits, selectable broadcast circuits, combinational circuits (including, but not limited to, MUX-based or XOR-based combinational circuits) with or without biasing circuits, feedback shift registers with or without phase shifters and/or biasing circuitry, and/or a feedback shift registers with reseeding.

It should be noted that any particular term usage such as the term "decompressor" should not be construed as limiting, as a term may encompass additional features understood by those of ordinary skill in the art or indicated by the context of how the term is used.

Exemplary Embodiments of the General Scheme

A large body of experimental evidence shows that test cubes, even those generated with a sophisticated dynamic compaction targeting multiple faults and performing multiple clock compression, have fill rates in the range from 1% to 5% only at the beginning of the process. After the first couple of vectors, the fill rate may drop well below 1%. FIG. 1 shows an example of such a test cube fill rate profile for an industrial design comprising 7M gates and 330K scan cells. In the first 64 patterns, the average fill rate is about 3.4% (11318 specified bits). After 320 patterns the fill rate drops below 1% and the average fill rate is about 0.2% (675 specified bits). Using traditional methods, a decompressor for this design may not utilize eight ATE (automatic test equipment) channels in the most efficient way. Although all the eight ATE channels may be necessary to deliver seed data for a few initial test cubes, successful compression of the remaining cubes requires less external channels. This is mirrored by the encoding efficiency, which drops from 96% to merely 8%.

Figure 2:
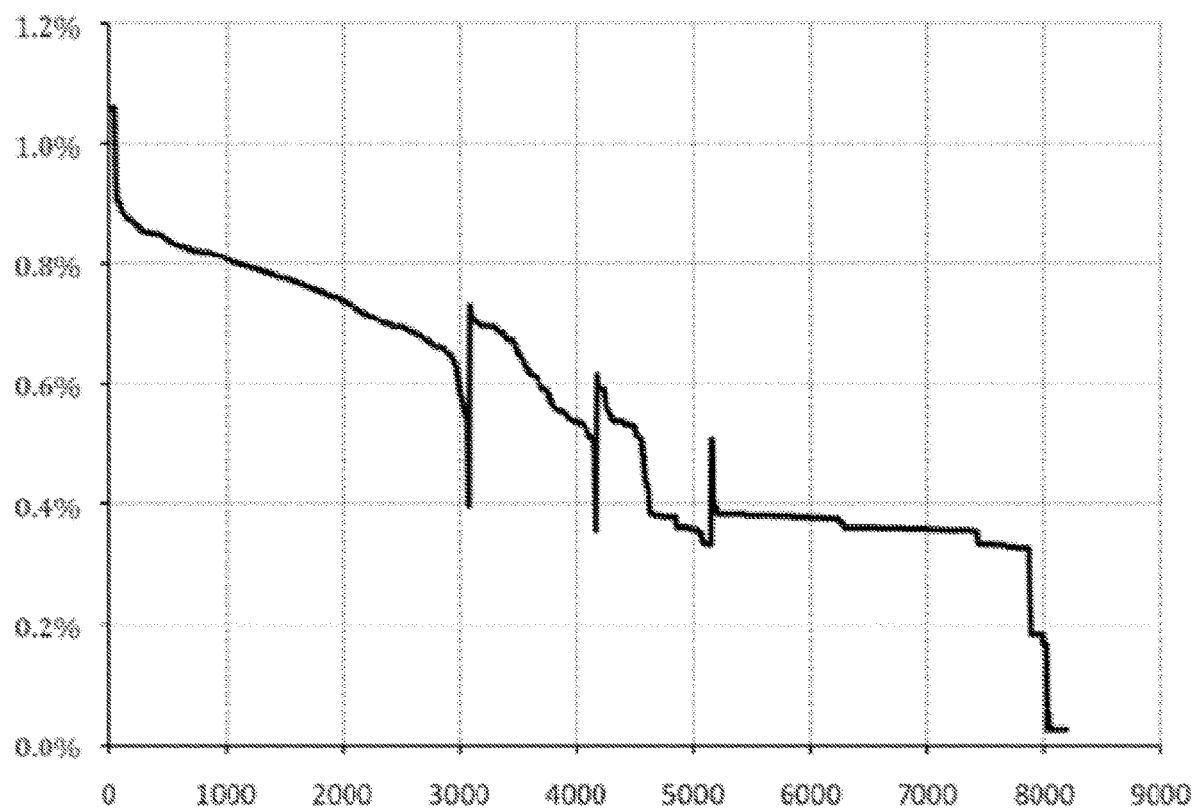
FIG. 2 illustrates a test cube fill rate profile for another industrial design.
Figure 3:
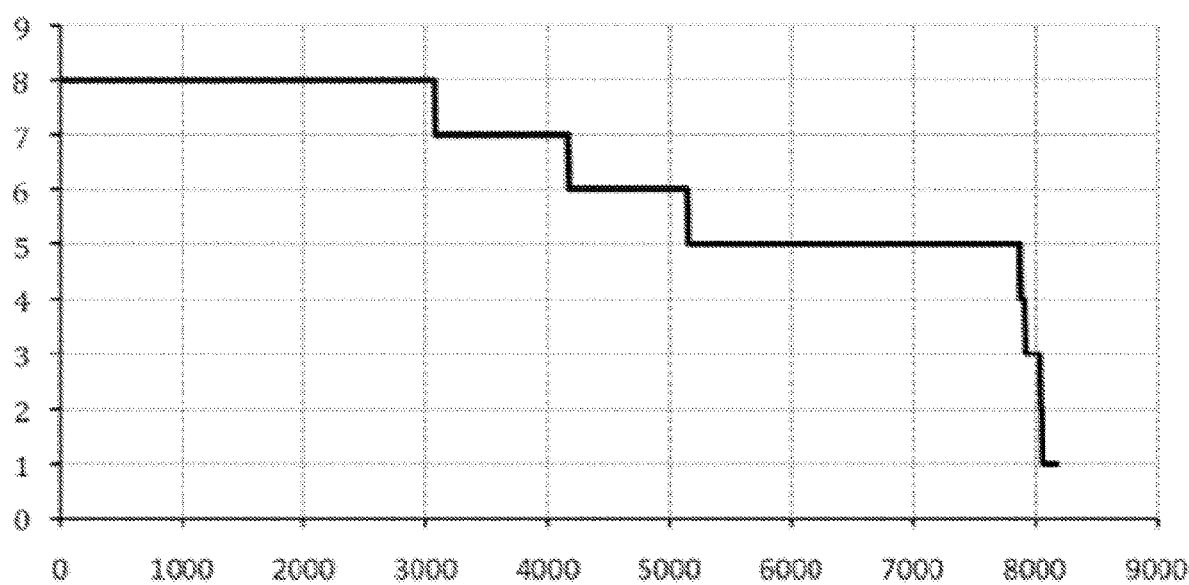
FIG. 3 illustrates the minimum numbers of ATE channels needed to encode the test cubes shown in FIG. 2.

A low encoding efficiency as well as channel overutilization is unavoidable by-products when operating a single test data decompressor with a fixed number of inputs. However, testing many cores in parallel within an SoC design may lead to new opportunities to improve the overall performance of a multicore chip compression, through dynamic channel assignments. In particular, a given core may receive data from a gradually decreasing or increasing number of ATE channels, thus elevating encoding efficiency accordingly. Consider another industrial test cubes profile shown in FIG. 2. As can be seen, the fill rate varies between 1.1% and 0.02% for more than 8,000 test patterns. Thus it may suffice to use a certain minimal number of ATE channels to EDT (embedded deterministic test) encode these vectors, as illustrated in FIG. 3. (Further details concerning the EDT testing scheme are provided in J. Rajski, J. Tyszer, M. Kassab, and N. Mukherjee, "Embedded deterministic test," *IEEE Trans. CAD*, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, all of which are hereby incorporated herein by reference.) Here, the corresponding decompressor inputs are determined for tests of FIG. 2 in such a way that all tests remain compressible.

Figure 4:
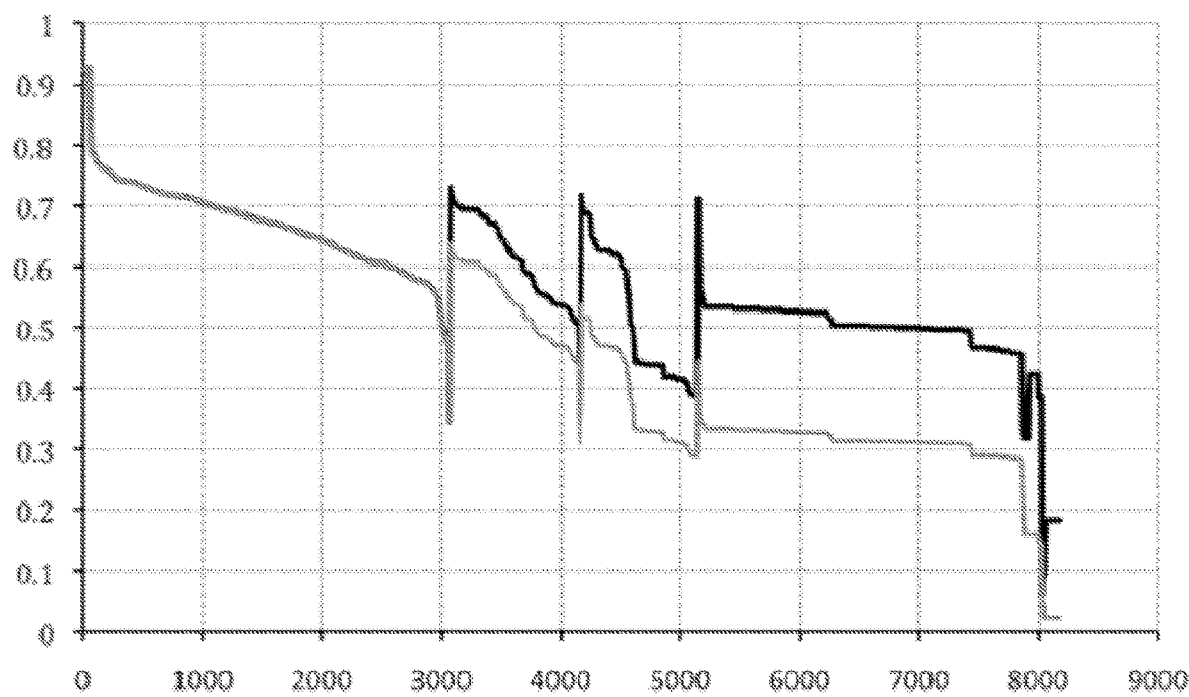
FIG. 4 illustrates the improved encoding efficiency when only as many ATE channels as shown in FIG. 3 are employed (the upper curve v the lower curve).

The trend of FIG. 3 can be used in a number of ways to improve utilization of the ATE interface bandwidth and test time. For instance, a flexible use of channels may result in improved compression ratios and encoding efficiency. FIG. 4 illustrates improved encoding efficiency for the test cubes of FIG. 2 by assuming that only as many channels as indicated by FIG. 3 are employed (the upper curve). By contrast, the gray curve (the lower curve) illustrates the encoding efficiency for the same patterns with 8 channels deployed during the entire test session. Efforts to assign ATE channels to different cores in accordance with their needs in different time slots may also end up shortening test application time and significantly reduce the number of external channels needed.

In the remaining sections of the disclosure, embodiments are introduced for how the external channel demands can be determined for successive cores of a given SoC design, how to efficiently use that information to guide test scheduling for each core, and how to implement a test access mechanism enabling such form of testing in a compression environment.

Figure 5:
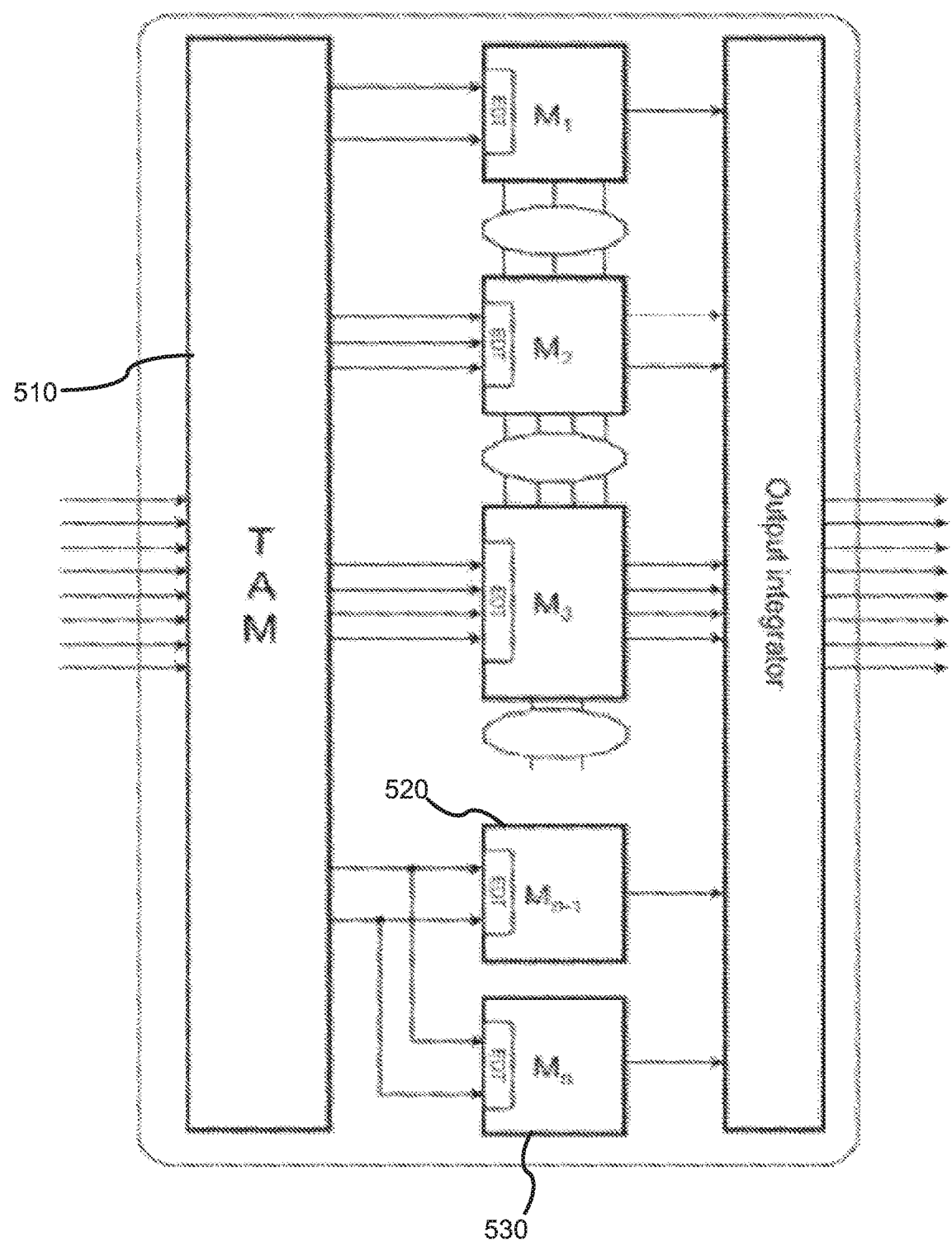
FIG. 5 illustrates an exemplary SoC test environment.

FIG. 5 shows an exemplary general structure of a testing scheme in accordance with the disclosed technology. In the illustrated embodiment, the external ATE channels feed a test access mechanism 510, which in turn reroutes seed variables to different cores based on control data provided by a test scheduler. Note that identical cores may share the same test data in the broadcast mode (as shown for two cores 520 and 530 at the bottom of the figure). The outputs of successive cores are connected to the output integrator, which, by performing some sort of response compaction, forms final test results, which are subsequently sent back to the ATE.

It is worth noting that internal cores are typically interconnected by means of their primary inputs and outputs communicating through some additional glue logic. To detect faults occurring in glue logic, an ATPG tool may produce test patterns involving groups of cores. As a result, for some patterns, a group of cores must be tested in parallel, and hence they are referred to as correlated cores. The presence of correlated cores, however, complicates test scheduling, and in many situations precludes the use of simple solutions improving test resource partitioning, such as reversing of test pattern order (with respect to fill rates), or slice-based scheduling of stackable blocks.

Solver with Multicore Cube Merging

As mentioned in the previous section, correlated cores need to be tested in parallel for a certain number of test patterns. Sometimes it poses a testing challenge, as testing a large number of cores simultaneously requires an abnormal test interface for a very few test patterns. This is best illustrated in Table I for two industrial SoC designs used in experiments reported in this disclosure. Design D1 comprises 52 heterogeneous cores, while design D2 features 43 modules (or cores). The initial number of test cubes in each case is equal to 713,817 and 78,206 for D1 and D2, respectively.

TABLE I

CORRELATED CORES STATISTICS

| Cores | Test cubes | | Configuration classes | |
|---|---|---|---|---|
| | # | % | # | % |
| Design D1 | | | | |
| 1 | 557,995 | 78.17 | 196 | 37.33 |
| 2 | 114,370 | 16.02 | 232 | 44.19 |
| 3 | 24,883 | 3.480 | 49 | 9.33 |
| 4 | 14,682 | 2.05 | 18 | 3.42 |
| 5 | 885 | 0.12 | 12 | 2.28 |
| 6 | 14 | 0.002 | 3 | 0.57 |
| 7 | 105 | 0.015 | 3 | 0.57 |
| 8-41 | 0 | 0.00 | 0 | 0.00 |
| 42-51 | 1 | 0.0001 | 1 | 0.19 |
| 52 | 873 | 0.12 | 2 | 0.38 |
| Design D2 | | | | |
| 1 | 39151 | 50.06 | 111 | 63.43 |
| 2 | 8943 | 11.44 | 26 | 14.86 |
| 3 | 0 | 0.00 | 0 | 0.00 |
| 4 | 14082 | 18.01 | 21 | 12.00 |
| 5 | 0 | 0.00 | 0 | 0.00 |
| 6 | 12164 | 15.55 | 12 | 6.86 |
| 7 | 0 | 0.00 | 0 | 0.00 |
| 8 | 3866 | 4.94 | 5 | 2.86 |
| 9-43 | 0 | 0.00 | 0 | 0.00 |

Each entry to the second (third) column of the table is the number (and the corresponding percentage) of test cubes whose specified bits are to occur in scan chains belonging to a given number of cores (listed in the first column). For example, the quantity taken from the fourth row of the table indicates that as many as 14,682 test cubes affect 4 different cores simultaneously. Every test cube may tackle a different 4-element subset of cores to be tested. As can be seen, the vast majority of cubes are confined to single cores. However, any performance gain from this observation will be difficult to realize if a core correlation is not properly addressed. Indeed, as a considerable fraction of test cubes still target two or more cores in parallel, it is desirable to judiciously manage their application in order to not compromise the resultant test coverage.

EDT compression treats the external test data as Boolean variables used to create expressions filling conceptually scan cells. See, e.g., J. Rajski, J. Tyszer, M. Kassab, and N. Mukherjee, "Embedded deterministic test," *IEEE Trans. CAD*, vol. 23, pp. 776-792, May 2004. Subsequently, a compressed pattern is obtained by solving a system of linear equations. In order to achieve a high degree of compression, the EDT incremental solver with dynamic compaction allows merging of several test cubes that packs more specified bits into a newly created test pattern. Exemplary embodiments of the multicore cube merging techniques of the present disclosure use certain constraints. For example, the merging technique only applies to test cubes that feature specified bits in the same cores according to some embodiments. Further, a subsequent test cube can be merged with the already existing test pattern provided such a merger is attainable for all involved cores. Then, having done cube merging, instances of the solver associated with a given core (e.g., every instance of the solver associated with a given core) attempt to compress the corresponding part of a test pattern in a particular manner, an exemplary of which is shown below.

Typically, Gaussian elimination deployed by the EDT solver determines the reduced row-echelon form of an equation system by picking leading variables in a sequence of their injections. For example, consider a decompressor with four inputs A, B, C, and D, and the following set of five hypothetical equations representing five specified bits:

$$d_0+a_1+d_1+a_2+a_3+d_3+c_4+d_4=1$$

$$b_0+a_1+b_1+a_2+c_2+a_4+d_4=1$$

$$b_0+c_0+d_1+a_2+b_3+d_3+a_4=1$$

$$a_0+d_0+a_1+b_1+d_1+a_2+c_2+a_4+b_4=1$$

$$a_0+d_0+b_2+d_3+a_4+b_4+d_4=1$$

where $a_i$, $b_i$, $c_i$, and $d_i$ are input variables injected during ith scan shift cycle through input channels A, B, C, and D, respectively. If selection of leading variables follows their time indexes, the above set of equations reduces to:

$$d_0+b_1+b_2+c_2+a_3+c_4=1$$

$$b_0+d_1+b_2+d_3+a_4=1$$

$$c_0+a_2+b_2+b_3=0$$

$$a_0+b_1+c_2+a_3+d_3+a_4+b_4+c_4+d_4=0$$

$$a_1+b_1+d_1+a_2+b_2+c_2+d_3+d_4=0$$

which implies a solution (all remaining variables are zeros)

$$d_0=1,\ b_0=1,\ c_0=0,\ a_0=0,\ a_1=0$$

As a result, all input channels (A, B, C and D) are needed to provide test data in this example. Given a set of linear equations, however, rows (or rows and columns) may be interchanged so as to put a particularly desirable element in a position from which the leading variable is about to be selected. This partial or full pivoting may have a bearing on deciding how many input channels are actually needed to compress a given test pattern. Consider again the example discussed above, this time, however, priority of choosing leading variables is given to their source channels rather than time of occurrence. This approach yields equations simplified as follows:

$$c_0+a_1+b_1+d_1+c_2+b_3+d_3+d_4=0$$

$$d_0+b_1+b_2+c_2+a_3+c_4=1$$

$$c_0+a_2+b_2+b_3=0$$

$$a_0+b_0+d_0+d_1+b_4+d_4=$$

$$b_0+d_1+b_2+d_3+a_4=1$$

It leads to a solution:

$$a_1=0, a_3=1, a_2=0, a_0=0, a_4=1$$

Now, a single channel A suffices to produce a given test cube rather than four ones used by the previous method. The presented pivoting method—which can be implemented as part of the compression process—can be used to construct channel profiles of test cubes such as the one of FIG. 3. In particular embodiments, this step follows a precomputing phase that splits multicore test cubes into individual single-core-based vectors so that they can be efficiently processed using information constrained to local compression logic of each core.

Correlated Cores

For each test pattern t obtained as a result of using the approach presented in the previous section, a descriptor $D(t)$ can be defined, where $D(t)=\{(m_1, c_1), (m_2, c_2), \ldots, (m_k, c_k)\}$. The descriptor indicates cores $m_1-m_k$ are to be accessed in parallel when applying test pattern t, with core $m_i$ using $c_i$ EDT input channels for this purpose. All test patterns having the same descriptor can be said to form a configuration class. Note that in certain embodiments, two descriptors are identical only when all $m_i$ and $c_i$ are exactly the same. It might be possible for two different test patterns to target the same subset of cores. However, if the input channels employed by these patterns differ, then they are regarded as incompatible and cannot belong to the same configuration class. A more detailed breakdown of configuration classes according to certain exemplary embodiments of the disclosed technology is given in the fourth column of Table I. The fifth column provides the same information as a percentage. Here the total numbers of compatibility classes for design D1 and D2 are further split into classes according to the amount of individual cores (the first column of the table) that need to be tested simultaneously. As an example, consider entry 49 for D1 in a row labeled 3. It says that there are 49 configuration classes that consist of test patterns having specified bits in 3 cores at the same time. Recall that each core within a given class uses only one arrangement of its input channels. Moreover, it is assumed throughout the rest of this disclosure that not only the number of such channels remains the same, but also that the way they are connected to a decompressor does not change from class to class to avoid re-computing of seed variables.

In addition to its pattern count P, every configuration class can be characterized by a channel capacity, which can be obtained as a sum $C=c_1+c_2+\ldots+c_k$. These quantities are parameters that can be used by test scheduling, as presented in the scheduling section below. A configuration class can be further characterized by combining individual properties of its member cores, such as power dissipation profiles. They can be also used to guide test scheduling so as not to exceed the maximum allowed power consumption at any time. Finally, a configuration class can be split into multiple segments such that test patterns from the same class will be applied in disjoint time intervals, if necessary. The ability to preempt a class may positively impact various figures of merit used to assess the quality of embodiments of the disclosed technology, including the ATE channel utilization, the total test application time, the volume of control data governing a test access mechanism, and others.

To run a test session for SoC designs using a conventional EDT compression environment would require a large ATE interface. For example, the total channel count for design D1 amounts to 221. The ability of an exemplary solver implemented according to the disclosed technology to arrive with optimal EDT channel assignments, in conjunction with an appropriate test scheduling and TAM design, can significantly alleviate this problem. Table II summarizes some statistics obtained for design D1 after compression. For those cores i of D1, which use more than a single input channel, columns T and M list the total number of test patterns that a given core receives, and the largest number of EDT channels the core needs to accommodate some of the compressed test data. The next column reports the average usage of EDT channels computed over all relevant test patterns by using the following formula:

$$w=T_{-1}\Sigma k \cdot p_k, k=1,\ldots,M \qquad (1)$$

where $p_k$ is the number of test patterns that work with k EDT channels. Eventually, the last column provides the channel reduction factor R given by $$R=1-\Sigma k \cdot p_k/T \cdot M=1-(w/M) \qquad (2)$$

Essentially, this is a ratio of the actual channel usage and the maximal channel occupancy, and is therefore (after subtracting from 1) indicative of savings one may expect due to a flexible channel allocation vs. using all channels during the entire test.

TABLE II

CORE-BASED CHANNEL UTILIZATION FOR D1

| i | T | M | w | R [%] |
|---|---|---|---|---|
| 2 | 12640 | 7 | 3.1 | 55.73 |
| 3 | 14760 | 8 | 5.8 | 28.16 |
| 4 | 14607 | 8 | 5.7 | 28.69 |
| 5 | 14514 | 9 | 5.7 | 36.67 |
| 6 | 14880 | 7 | 5.7 | 19.20 |
| 7 | 2935 | 3 | 1.6 | 45.25 |
| 8 | 11649 | 4 | 1.3 | 66.75 |
| 9 | 2705 | 5 | 3.2 | 35.51 |
| 10 | 2423 | 2 | 1.3 | 35.41 |
| 11 | 24324 | 5 | 1.1 | 77.49 |
| 12 | 1639 | 4 | 3.7 | 8.47 |
| 13 | 1610 | 4 | 3.7 | 7.22 |
| 14 | 1598 | 4 | 3.7 | 6.79 |
| 15 | 1600 | 4 | 3.7 | 7.64 |
| 16 | 15426 | 9 | 3.8 | 57.30 |
| 17 | 20797 | 6 | 2.1 | 65.11 |
| 18 | 11585 | 8 | 5.6 | 30.61 |
| 19 | 11641 | 8 | 5.5 | 31.05 |
| 20 | 11548 | 8 | 5.5 | 30.77 |
| 21 | 11320 | 8 | 5.6 | 30.20 |
| 22 | 3636 | 4 | 2.9 | 26.45 |
| 23 | 3594 | 4 | 2.9 | 26.14 |
| 24 | 3574 | 4 | 3.0 | 25.80 |

TABLE II-continued

CORE-BASED CHANNEL UTILIZATION FOR D1

| i | T | M | w | R [%] |
|---|---|---|---|---|
| 25 | 3572 | 4 | 2.9 | 25.97 |
| 26 | 1593 | 3 | 1.7 | 43.13 |
| 27 | 1632 | 3 | 1.7 | 44.32 |
| 28 | 1613 | 3 | 1.7 | 43.67 |
| 29 | 1590 | 3 | 1.7 | 43.14 |
| 30 | 2389 | 2 | 1.4 | 28.42 |
| 31 | 2262 | 2 | 1.4 | 30.31 |
| 32 | 2402 | 2 | 1.4 | 31.35 |
| 33 | 2405 | 2 | 1.4 | 31.43 |
| 50 | 7562 | 7 | 6.0 | 14.19 |
| 51 | 2831 | 7 | 5.4 | 23.36 |
| 52 | 7520 | 7 | 6.0 | 14.01 |
| 53 | 7470 | 7 | 6.0 | 13.95 |
| 54 | 13514 | 8 | 2.8 | 64.58 |
| 55 | 1536 | 4 | 2.5 | 38.38 |
| 56 | 1513 | 4 | 2.5 | 37.79 |
| 57 | 28037 | 3 | 1.0 | 66.40 |

An Exemplary Two Stage Test-Scheduling Technique

Figure 10:
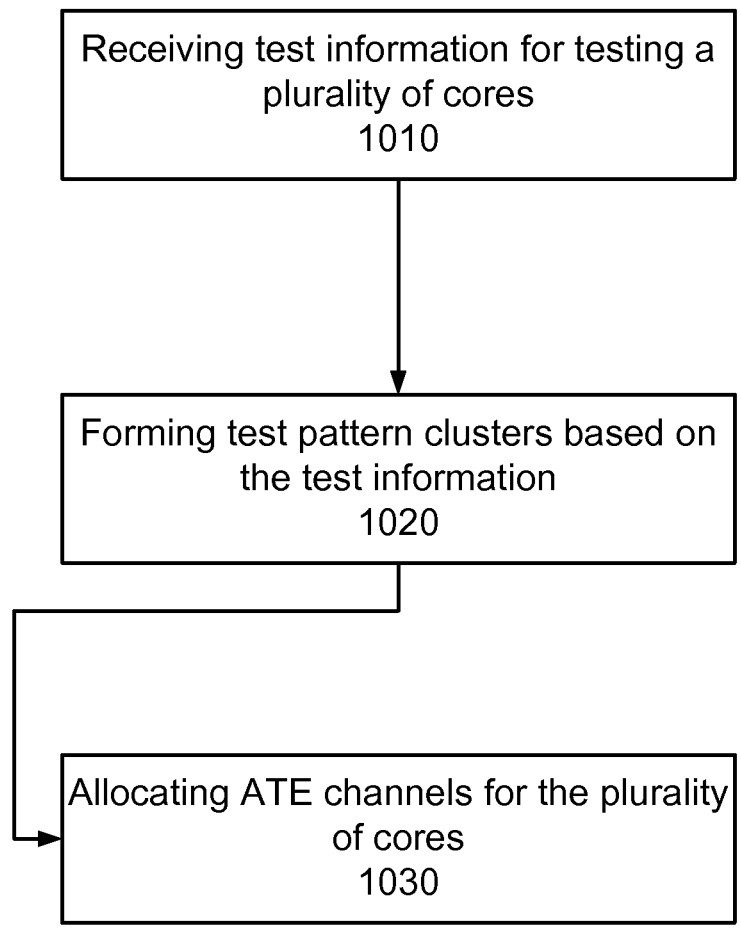
FIG. 10 illustrates a flow chart describing methods of test scheduling according to various embodiments of the invention.

FIG. 10 is a flowchart illustrating an exemplary embodiment for test scheduling. At 1010, test information is received. The test information, including compressed test data that encode a plurality of test patterns for testing a plurality of cores in a circuit and ATE (automatic test equipment) channel requirements for delivering the compressed test data to the plurality of cores, may be derived according to methods described above. In the EDT environment, the number of ATE channels required corresponds to the number of EDT channel required. At 1020, test pattern clusters are formed based on the received test information. A test pattern cluster includes test patterns that can be delivered to the circuit in parallel. As already mentioned, a test pattern cluster is also referred to as a base cluster or a base class. At 1030, the ATE channel allocation information is generated for the plurality of cores. Accordingly, the exemplary scheduling technique comprises two major phases, the formation of test pattern clusters 1020 and the allocation of ATE channels 1030, and will be discussed in detail below.

An exemplary procedure for forming test pattern clusters 1020 involves merging (combining) complementary configuration classes. In certain embodiments, two configuration classes are complementary if they comprise disjoint subsets of cores. The merging procedure can maintain a list of configuration classes, which can be sorted in descending order with respect to the product P·C of a pattern count and the channel capacity they feature. As a result, the list can begin with a class having the largest combined resource request in terms of an ATE interface size and test time. In particular embodiments, it helps to create a test schedule having the largest assignments as its early tasks.

One of the steps involved in the exemplary merging procedure is the selection of a configuration class to add next to those merged earlier, further referred to as a base class, a base cluster or a test pattern cluster (these three terms are used interchangeably in this disclosure). In certain embodiments, a simple greedy algorithm can be deployed to find a sequence of classes susceptible of effective merging. This process can further depend on a concept of degree of fitness.

Given a configuration class x that is complementary with the base, the degree of its fitness can be given by the number of cores that constitute class x times the pattern count of x, P(x). In other words, and according to certain exemplary embodiments, the best candidate for merging with the base is a class that features the largest subset of cores not yet included into the base with the largest number of associated test patterns. Given configuration classes gathered on the sorted list, embodiments of the disclosed method can begin by assigning its first element to the current result b of merging to form a base. Then, the method can iterate over remaining configuration classes (e.g., all the remaining configuration classes) and expand the base cluster one class at a time, taking next a class with the largest degree of fitness. Furthermore, in order to be merged and according to some exemplary embodiments, a given configuration class x can be required to meet one additional condition: its channel capacity C(x) altogether with a channel capacity C(b) of the current base cluster cannot exceed a user-selected or predetermined threshold value Φ. For example, $$C(x)+C(b) \leq \Phi \quad (3)$$

Controlling the parameter Φ allows one to trade off the total number of ATE channels and test application time.

It is worth noting that when merging classes b and x in accordance with embodiments of the method introduced above, there are three possible scenarios as far as their pattern counts P(b) and P(x) are concerned: (1) P(b)=P(x), (2) P(b)<P(x), and (3) P(b)>P(x). In the first case, the class x can be removed from the list as it joins the base. In the second case, the configuration class x can be added to the base class but with the pattern count reduced to that of the base class. Moreover, a copy of class x can be moved back to the list with a new pattern count equal to P(x)−P(b). Finally, if the pattern count of the base class is greater than that of class x, then class x can be removed from the list, the pattern count of the base can be adjusted to a new (smaller) value P(x), and the former base class can be returned to the list with the pattern count equal to P(b)−P(x). As can be noticed, scenarios (2) and (3) preserve the size of the list, whereas case (1) reduces its size by one.

In certain embodiments, the process of forming the base class terminates when either there are no more configuration classes complementary with the base, or condition (3) cannot be satisfied. The merging procedure can then remove the first element from the list and attempt to form another base cluster until the list of configuration classes becomes empty, in which case the first phase of the scheduling algorithm returns results: for example, a list {b1, b2, . . . , bn} of base clusters, and/or a core distribution histogram H. Entry H(k) to the histogram indicates how many base clusters host core k. For example, H(3)=5 means that core 3 occurs in 5 different base classes. Note that in the embodiments introduced above, the list of base classes determines the actual schedule (the order according to which successive cores will be tested). It can be further modified, for instance, by reordering the list in an attempt to group tests for the same core in contiguous time intervals.

The formation of test pattern clusters 1020 is followed by the generating ATE channel allocation information 1030. According to certain embodiments of the disclosed technology, during an iteration of the allocation process, the ATE channel allocation process begins with a free channel c, the list of base clusters, and histogram H. The technique finds a core k with the largest value of H(k), assigns channel c to core k in all base clusters of its occurrence, and decreases channel counters in these base classes, accordingly. When a channel counter reaches the value of zero, the corresponding entry of H is decreased to indicate that all requested channels have already been assigned to a given core within one of the base classes.

As can be seen, the first core, say F, assigned to a given channel is typically the one with the largest pattern count (as hosted by the largest number of base classes). However, time slots where core F is missing, are still available. The problem of filling such "holes" can be resolved by adapting two different techniques, as shown in the following paragraphs.

The first approach, referred to as a best-fit scheme, selects a core whose presence in the base classes corresponding to free time slots is the most prominent. This core is then assigned to the channel currently being considered. The best-fit approach tackles the remaining free slots using the same strategy until the channel is completely allocated. It is worth noting that this scheme can be used to guarantee that the total number of ATE channels used in this process will remain equal to the threshold $\Phi$ defined earlier during the merging phase of the technique. Due to likely assignments of a given channel to many cores, however, it may result in a relatively complex TAM design, as discussed below.

Another technique, referred to as a balanced fit scheme, attempts to reduce the number of different channels assigned to a single core at the price of extra ATE channels. In certain embodiments, the technique breaks number H(k) into two components: the number u of time slots where core k can still be assigned to channel c, and the remaining H(k)−u time slots where channel c is already assigned to another core. A core with the largest value of a difference $$\delta = u - (H(k) - u) = 2u - H(k) \quad (4)$$

is then assigned a channel provided $\delta > \Delta$ where $\Delta$ is a user-defined or predetermined parameter. If there are no cores with $\delta$ greater than $\Delta$, then the channel remains idle during this particular time slot. As can be seen, given a core, the larger number of free slots with reference to slots already taken, the more beneficial it is to fill the free time slots with such a core as the number of different channels it uses will remain relatively small. Since increasing the value of $\Delta$ decreases the number of employed channels in certain embodiments of the disclosed technology, it is desirable to use nonnegative values of $\Delta$.

Figure 6:
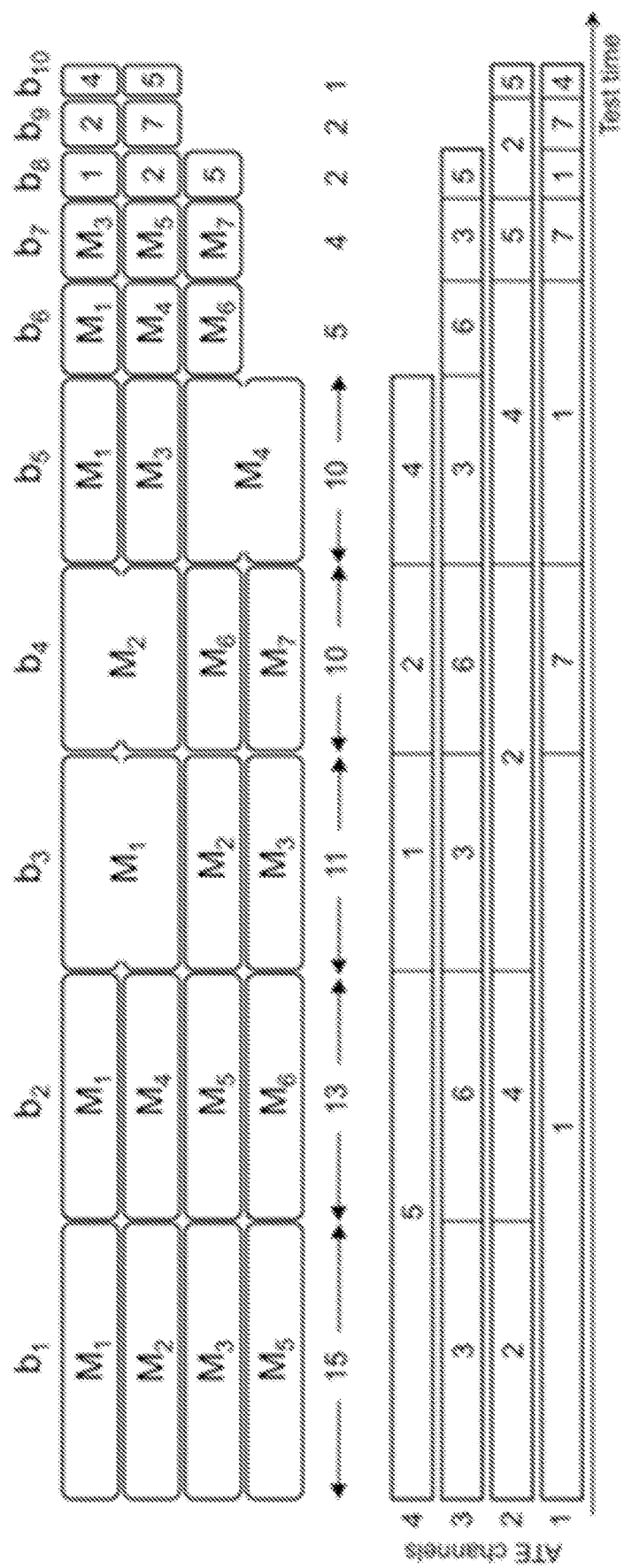
FIG. 6 illustrates an example of base clusters (test pattern clusters) and the corresponding best-fit-based test schedule.

Consider a simple list of base classes created for $\Phi=4$ and shown in the upper part of FIG. 6. The list is comprised of 10 elements, each of them being further partitioned into components representing member cores. The size of each box is proportional to the channel requests (vertical) and the pattern counts (horizontal) of each core. It is worth noting that assigning the ATE channels to successive cores directly from the list would result in 21 different connections between the channels and the cores. This number is obtained by counting different cores occurring in each row of the figure. For example the second row features 6 cores that a given ATE channel would need to serve: M2, M4, M1, M3, M5, and M7. The lower part of the figure is a best-fit-strategy-based solution (according to the embodiment introduced above) of this particular test-scheduling problem. As a result, channel 1 was first assigned to core M1 that is present in as many as 6 base clusters—the most active block at this stage. Cores M7 and M4 used the remaining 3 and 1 slots, respectively. The same technique was employed by repeatedly assigning next channels, as shown in the figure. The resultant schedule reduces the number of connections between the ATE channels and the cores to 13, only. Again, this result is a sum of different cores over all four channels, as depicted in FIG. 6.

The solution of FIG. 6 is also indicative of an interesting trend: base classes located on the right hand side appear to have much smaller pattern counts than their earlier counterparts. This is a side effect of the base-list maintenance operations when running the exemplary merging procedure. Recall that, in this embodiment, components of a given base have the same pattern counts. Consequently, the list keeps configuration classes with counts being gradually reduced, as already discussed in this section.

Test Access Network Architecture

According to certain embodiments of the disclosed technology, a test schedule (e.g., the test schedule produced as shown in the previous section) can be used to guide a design process for a test access mechanism. In order to avoid rearranging linear equations for different test patterns, it can be assumed that EDT inputs of individual cores are deployed in the same ascending order (e.g., a single input request always results in assigning EDT input 1, a two-input request ends up with EDT inputs 1 and 2, a three-input request will involve EDT inputs 1, 2, and 3, and so on). In other words, the exclusive use of EDT inputs 1 and 3 is not allowed.

Figure 7:
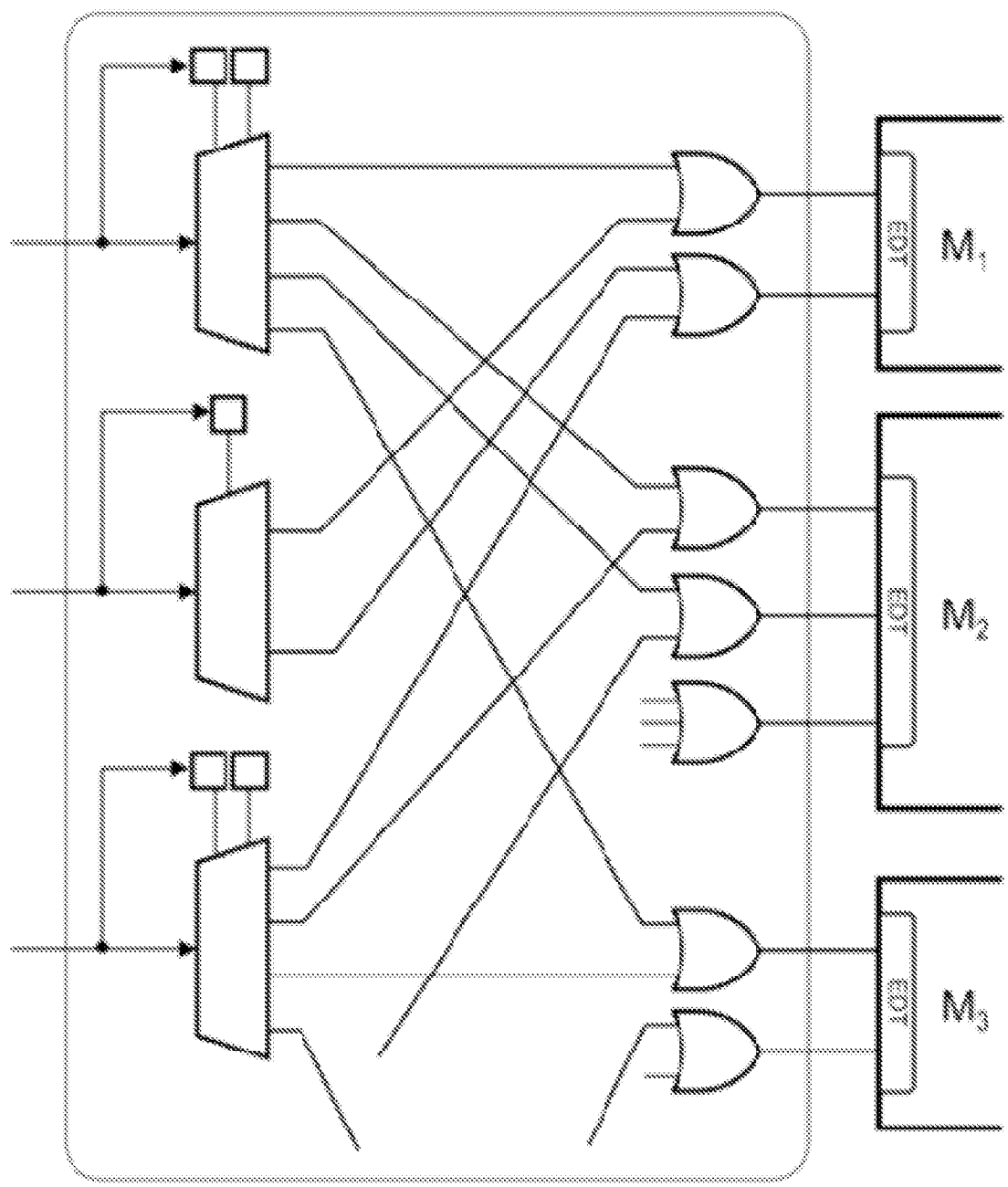
FIG. 7 illustrates an exemplary test access circuitry comprising a rearrangeable interconnection network.

In certain embodiments of the disclosed technology, the test access circuitry comprises a rearrangeable interconnection network illustrated in FIG. 7. The exemplary network comprises n 1-bit demultiplexers, where n is the number of ATE channels. In the illustrated embodiment, each demultiplexer serves to connect a designated channel to a single destination core. The associated address register specifies which core is to be selected for a given test pattern. Its content is uploaded through the same ATE channel at the beginning of the scan-in shift as a header of a compressed test vector. The number of demultiplexer outputs is at least equal to the number of cores it serves. It can be larger, though, as some demultiplexers may provide data to several EDT inputs of the same core. The inverse of this case is having several demultiplexers (ATE channels) feeding the same EDT input. OR gates placed in the front of each core facilitate this type of connectivity.

In principle, a wiring network of the test access circuitry can be designed in a straightforward fashion based on data provided by the scheduling algorithm. Consider a 7-input core that was assigned 9 ATE channels in 13 time slots as follows:

(9) (6 9) (5 6 7 9) (4 5 6 9) (4 5 6 7 9) (4 6 9) (5 6 9) (4 5 6 7 8 9) (3 4 5 6 7 8 9) (2 3 5 6 7 8 9) (5 6 7 8 9) (3 5 6 7 8 9) (1 3 5 6 7 8 9)

For example, item (6 9) could be utilized to connect ATE channels 6 and 9 with EDT inputs 1 and 2, respectively. This rule, however, would lead to linking EDT input 1 with 7 ATE channels (9, 6, 5, 4, 3, 2, 1), input 2 would be receiving data from 5 ATE channels (9, 6, 5, 4, 3), and so forth, as shown in FIG. 8a. This exemplary network incurs 26 wires in total. A greedy technique can be used to cure this problem. For example, in certain embodiments, the technique first determines an ATE channel most frequently used in all assignments. This channel is then connected with EDT input 1 anywhere it is used. The next most popular channel is subsequently deployed to fill the first unused EDT input in all time slots. This technique can continue as long as there exist unconnected ATE channels. As a result, one may arrive with the following channel assignments for the earlier example (FIG. 8b):

(9) (9 6) (9 6 5 7) (9 6 5 4) (9 6 5 7 4) (9 6 4) (9 6 5) (9 6 5 7 8 4) (9 6 5 7 8 4 3) (9 6 5 7 8 3 2) (9 6 5 7 8) (9 6 5 7 8 3) (9 6 5 7 8 3 1)

As can be seen, the number of internal connections has been reduced to 13 wires.

As shown in Table I, for a short period of time, it may be desirable to provide test data to almost all cores simultaneously. It would not be feasible to use additional ATE channels just to transfer a few test patterns. Thus, in some embodiments of the disclosed technology, such vectors are delivered gradually in phases, each time shifting data to a subset of cores while freezing the remaining cores by means of either clock gating (if available) or converting scan chains into a cyclic path with a disabled decompressor.

Output Integrator

In exemplary embodiments of the disclosed technology, an output integrator (see FIG. 5) is employed to group all individual outputs of cores and to reduce the number of data streams so that they fit into the number of output ATE channels. While merging test responses is mainly achieved by using XOR trees, mapping of the core outputs into the output channels should prevent highly correlated cores (with a large number of common patterns) from sharing the same output channels. This is to avoid error masking caused by homogenous cores (typically stimulated in a broadcast mode, and thus having identical pattern counts), where a systematic defect may manifest itself in a number of modules at the same time. Furthermore, observing cores tested simultaneously on different outputs improves diagnostic capabilities of the scheme. A similar rationale applies to different outputs of a single core. Treated as outputs of different modules totally correlated, they end up connected to different ATE channels, thus enabling more accurate diagnosis of group of scan chains of a given core. Synthesis of an exemplary output integrator is summarized in the following paragraphs.

In certain embodiments of the disclosed technology, the output channel mapping is carried out as follows. Let $\rho_{xy}$ be a correlation coefficient between cores x and y (or outputs x and y of a single core). The correlation coefficient can be defined as a ratio of the number of test patterns shared by x and y to the total number of patterns used to test core x. Note that in general $\rho_{xy} \neq \rho_{yx}$. For identical blocks or outputs of the same core $\rho_{xy}=1.0$. Initially, while there exist unassigned ATE channels, two cores x and y with the highest value of $\rho_{xy}$ or $\rho_{yx}$ are selected. x and y are assigned to different XOR trees, and x and y are marked as already connected to the outputs.

After initializing the XOR trees, as long as unassigned cores (or their outputs) exist, the technique can repeatedly apply the following operations. For core x and for XOR tree t (e.g., for every core x and for every XOR tree t), a sum of correlation coefficients ($\rho_{xy}+\rho_{yx}$) can be computed over all cores y already connected to t. A core and an XOR tree with the smallest value of the sum are then selected to establish a new core-output link, whereas the core is marked as connected.

Experimental Results

Embodiments of the exemplary scheme introduced above were tested on two large industrial SoC designs. This section reports results obtained for both stuck-at tests and launch-off-capture transition tests. The basic data regarding the designs: the number of cores, the number of test patterns, as well as the number of configuration classes can be found in the previous sections.

Figure 8:
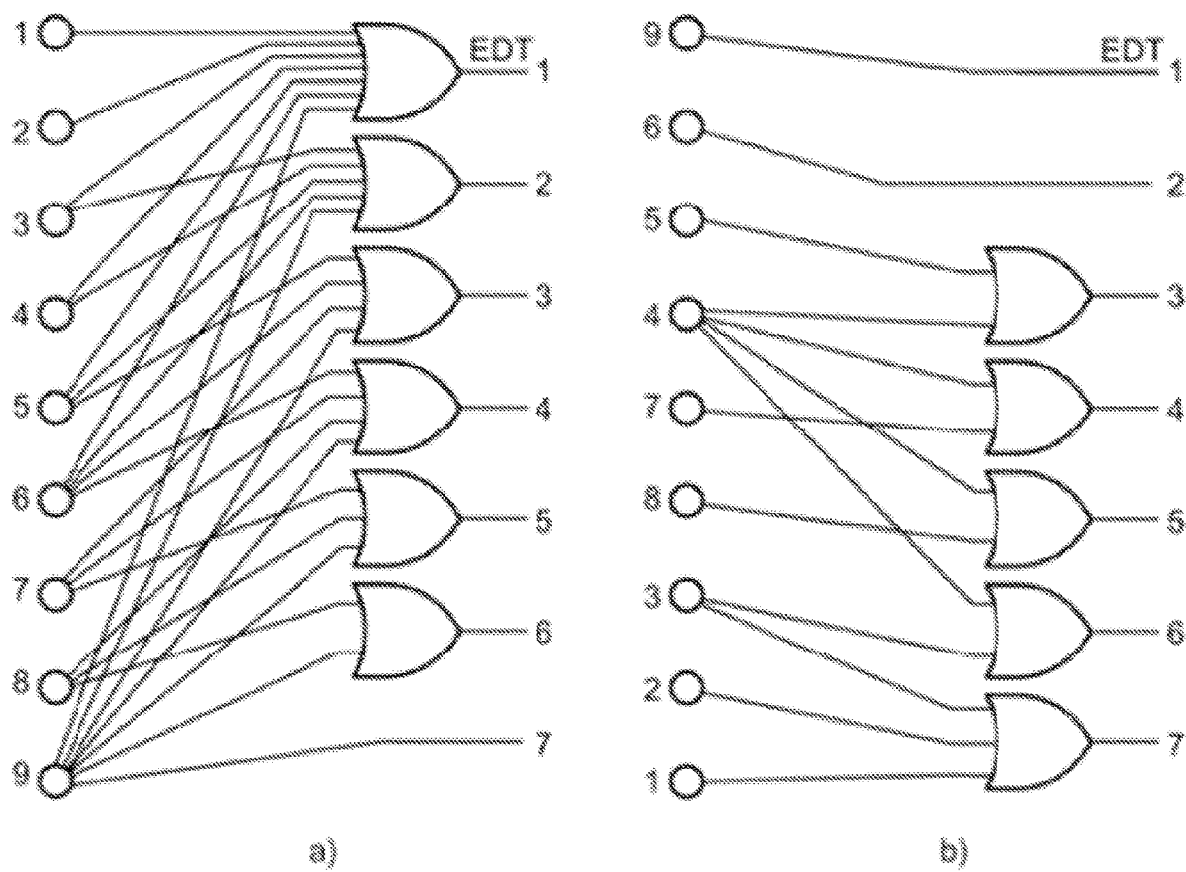
FIG. 8a illustrates an example of a wiring network of a test access circuitry designed in a straightforward fashion.
FIG. 8b illustrates an example of a wiring network of a test access circuitry designed using a simple greedy algorithm.

The experimental results are summarized in Table III. The first column provides the number of cores, the total number of EDT channels used in all cores together (this number would define the interface size if no scheduling was used), the total number of scan chains, the number of scan cells, and the gate count. The second column specifies the channel allocation method, while the third one gives the number $\Phi$ of channels used by the class-merging method. The remaining parts of Table III list the following performance-related statistics of the proposed scheme:

- the resultant number of base clusters,
- the total number of bits employed to control TAM demultiplexers when applying successive test patterns,
- the number of internal wires within an interconnection network, as illustrated in FIG. 8,
- the final number of ATE input channels determined by the exemplary scheduling method (recall that this value remains the same as that provided when the best-fit technique is used to assign channels),
- the test application time reported here as a ratio of the longest channel occupancy Q (referring to FIG. 6, it can be regarded as the widest rectangle associated with a given channel, though it may feature a number of holes when a channel is not used) to the highest pattern count among all cores (28073 for D1 and 1302 for D2); this figure of merit is indicative of how long it actually takes to apply all vectors compared to a scenario when all cores could be tested in parallel,
- the compression increase computed as a ratio of test data volume V required by a conventional EDT-based scheme and that of the proposed method; $V=C \cdot P \cdot L$, where C is the total number of EDT inputs (shown in the first column), P gives the largest pattern count among all cores, and L is the size of the longest scan chain; test data used by the new scheme includes control bits and a sum over all base classes—for every base b, $C' \cdot P(b) \cdot L(b)$ is determined, where $C'$ is the number of ATE input channels, P(b) provides a pattern count for class b, and L(b) is the size of the longest scan chain within cores belonging to class b,
- the channel fill rate $P/(Q \cdot \Phi)$, where P is the sum of all test patterns applied through all ATE inputs; it indicates the actual usage of the ATE channels, and it only assumes the value of 1.0 if all channels are used uninterruptedly till the very end of test—for the schedule of FIG. 6 the channel fill rate is equal to 275/292=0.9418,
- the channel overhead that mirrors, in a numerical manner, the amount of extra ATE channels assigned to the cores in response to their per pattern input requests; given a single core and test patterns that use c channels, it is computed as $w \cdot r/c$, where r is the actual number of different ATE channels used to deliver the test patterns, and w is the fraction of test patterns using c channels; the final statistic is given in Table III as the average computed over all channel requirements, and then, over all the cores.

TABLE III

EXPERIMENTAL RESULTS

| Design | Allocation algorithm | $\Phi$ | The number of bases | Control data volume | TAM internal wires | ATE input channels | Test time | Compression over EDT | Channel fill rate | Channel overhead |
|---|---|---|---|---|---|---|---|---|---|---|
| D1 | Best-fit | 15 | 468 | 54,756 | 1016 | 15 | 2.72 | 5.03x | 0.9878 | 2.2897 |
| Cores: 57 | Best-fit | 21 | 379 | 60,261 | 1157 | 21 | 1.94 | 5.00x | 0.9925 | 2.5127 |
| EDT inputs: 211 | Best-fit* | 28 | 342 | 71,136 | 1332 | 28 | 1.45 | 4.91x | 0.9966 | 2.7403 |

TABLE III-continued

EXPERIMENTAL RESULTS

| Design | Allocation algorithm | Φ | The number of bases | Control data volume | TAM internal wires | ATE input channels | Test time | Compression over EDT | Channel fill rate | Channel overhead |
|---|---|---|---|---|---|---|---|---|---|---|
| Scan chains: 18K | Best-fit | 32 | 401 | 94,235 | 1462 | 32 | 1.29 | 4.77x | 0.9771 | 2.6239 |
| Scan cells: 1.9M | Balanced-fit | 15 | 468 | 75,816 | 688 | 25 | 2.72 | 3.02x | 0.5927 | 1.8100 |
| Longest scan: 159 | Balanced-fit | 21 | 379 | 77,316 | 707 | 32 | 1.94 | 3.28x | 0.6513 | 1.7233 |
| Gates: 34M | Balanced-fit* | 28 | 342 | 88,236 | 781 | 41 | 1.45 | 3.35x | 0.6806 | 1.8977 |
|  | Balanced-fit | 32 | 401 | 115,087 | 803 | 46 | 1.29 | 3.32x | 0.6797 | 1.7676 |
| D2 | Best-fit | 29 | 127 | 23,114 | 929 | 29 | 2.29 | 3.33x | 0.9809 | 1.3665 |
| Cores: 43 | Best-fit | 38 | 94 | 22,372 | 934 | 38 | 1.73 | 3.33x | 0.9889 | 1.5053 |
| EDT inputs: 223 | Best-fit | 47 | 99 | 28,809 | 1033 | 47 | 1.39 | 3.32x | 0.9934 | 1.5113 |
| Scan chains: 36K | Best-fit | 58 | 102 | 36,312 | 1117 | 58 | 1.13 | 3.28x | 0.9932 | 1.5521 |
| Scan cells: 4.4M | Balanced-fit | 29 | 127 | 28,321 | 692 | 43 | 2.29 | 2.25x | 0.6615 | 1.1213 |
| Longest scan: 164 | Balanced-fit | 38 | 94 | 27,260 | 673 | 56 | 1.73 | 2.26x | 0.6711 | 1.2858 |
| Gates: 98M | Balanced-fit | 47 | 99 | 34,551 | 704 | 68 | 1.39 | 2.30x | 0.6866 | 1.2681 |
|  | Balanced-fit | 58 | 102 | 42,126 | 723 | 81 | 1.13 | 2.35x | 0.7112 | 1.2418 |

Figure 9:
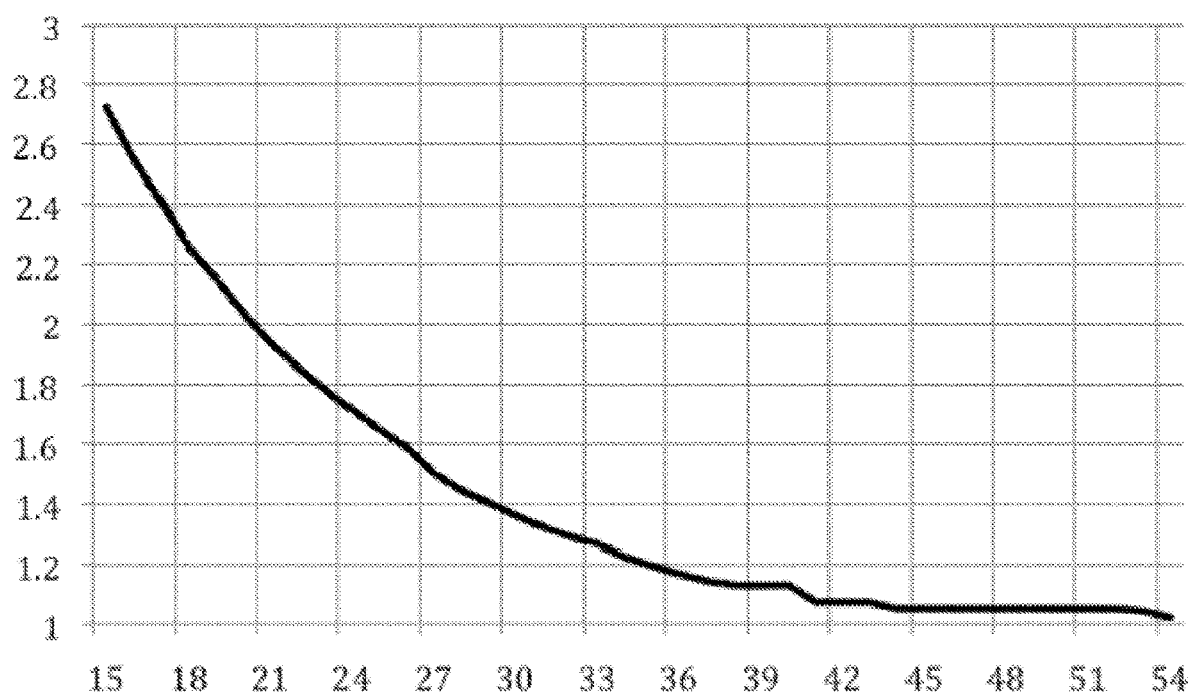
FIG. 9 illustrates the relation between ATE channels and the resultant test time for design D1.

As indicated in Table III, for each design and for each al-location algorithm, the smallest number of ATE channels (and the corresponding channel reduction factor) that guarantee virtually uncompromised test application time determined by the exemplary scheduling method is reported. It appears that one can reduce up to 5 times the number of EDT inputs and still be able to deliver all test pat-terns within the original time frame. A further reduction of the ATE interface bandwidth offers interesting trade-offs. For example, test application time, although gradually increasing due to decreasing input channels, is counter-balanced by visible compression gains (up to 5x). As a result, the effective EDT compression is elevated from 78x and 393x to 392x and 1770x for D1 and D2, respectively. An intrinsic relation between ATE channels and the resultant test time is illustrated in FIG. 9 for design D1. As can be seen, from 54 channels (where test time remains unaffected) down to 15 inputs (resulting in high compression), there are remarkable trade-offs between test time, volume of test data, and the TAM design complexity that one can control, as also pronounced by the actual usage of ATE channels and their assignments (see the last two columns).

Exemplary Computing Environments

Figure 11:
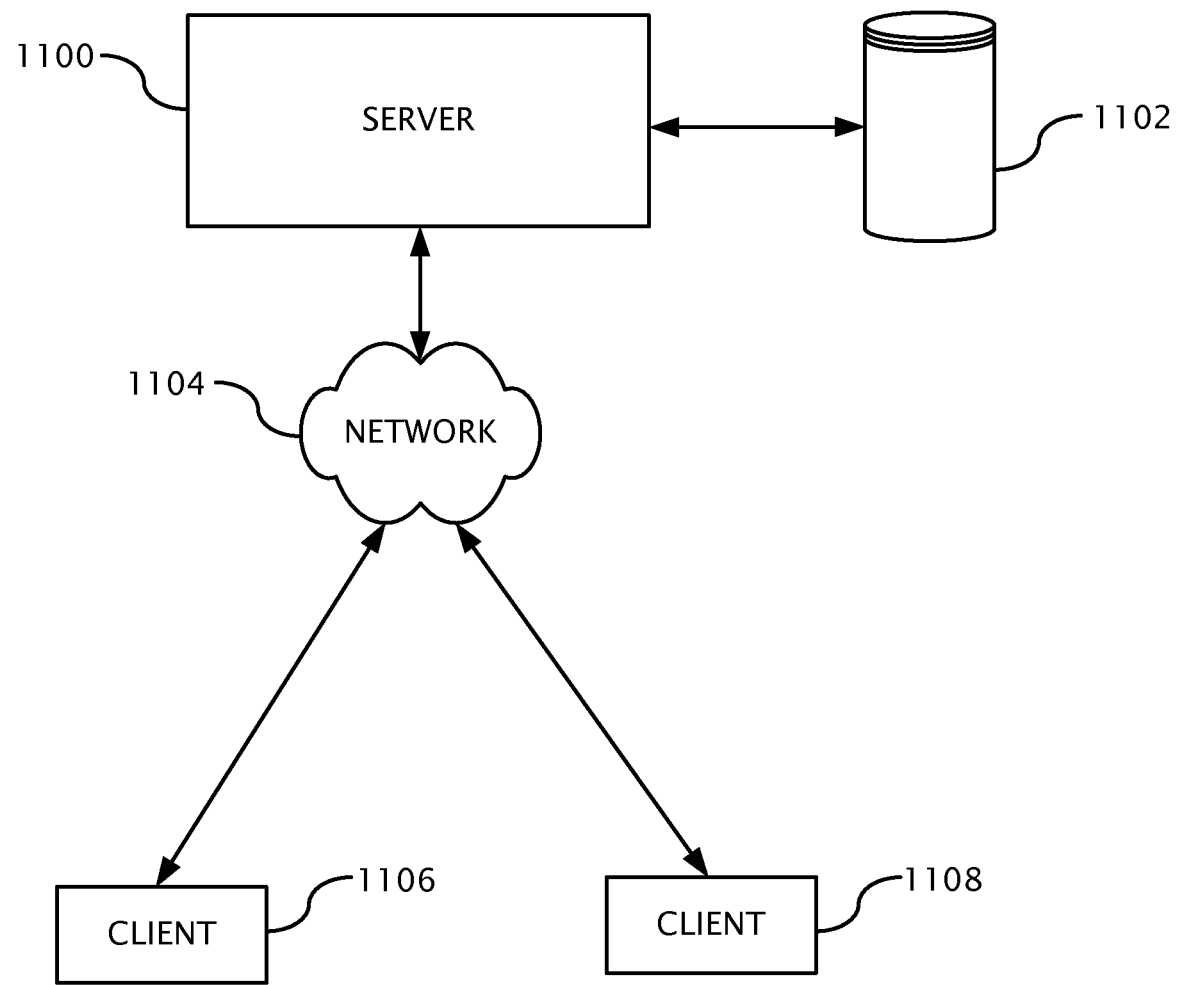
FIG. 11 illustrates a schematic block diagram of a first distributed computing network as can be used to perform or implement any of the disclosed embodiments.

Any of the aspects of the technology described above may be performed using a distributed computer network. FIG. 11 shows one suitable exemplary network. A server computer 1100 can have an associated storage device 1102 (internal or external to the server computer). For example, the server computer 1100 can be configured to generate test patterns, compressed test data, and test schedules according to any of the disclosed methods or to generate design data such as TAM for implementing any of the disclosed architectures (for example, as part of an EDA software tool, such as a test pattern generation tool). The server computer 1100 can be coupled to a network, shown generally at 1104, which can comprise, for example, a wide-area network, a local-area network, a client-server network, the Internet, or other suitable network. One or more client computers, such as those shown at 1106, 1108, may be coupled to the network 1104 using a network protocol. The work may also be performed on a single, dedicated workstation, which has its own memory and one or more CPUs.

Figure 12:
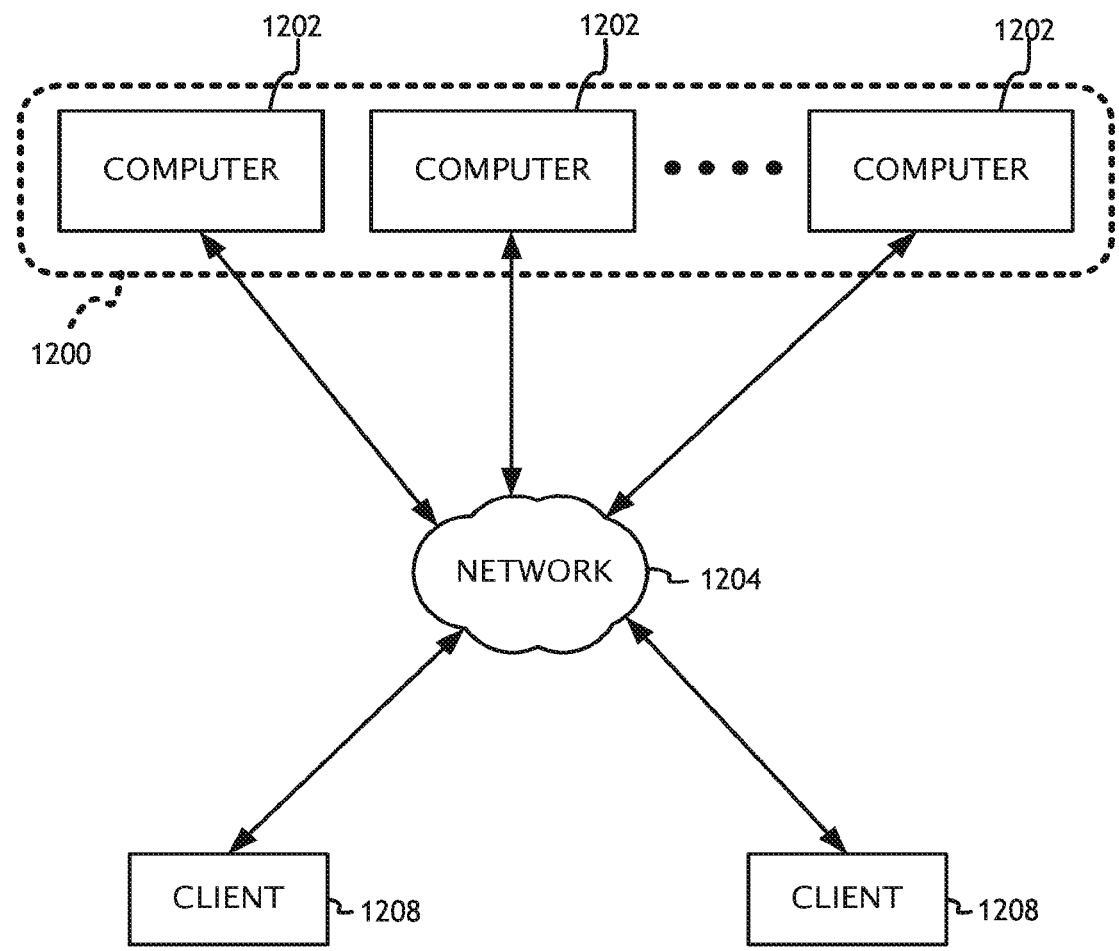
FIG. 12 illustrates a schematic block diagram of a second distributed computing network as can be used to perform or implement any of the disclosed embodiments.

FIG. 12 shows another exemplary network. One or more computers 1202 communicate via a network 1204 and form a computing environment 1200 (for example, a distributed computing environment). Each of the computers 1202 in the computing environment 1200 can be used to perform at least a portion of the test pattern and compressed test data generation, test scheduling, or test hardware generation process. The network 1204 in the illustrated embodiment is also coupled to one or more client computers 1208.

Figure 13:
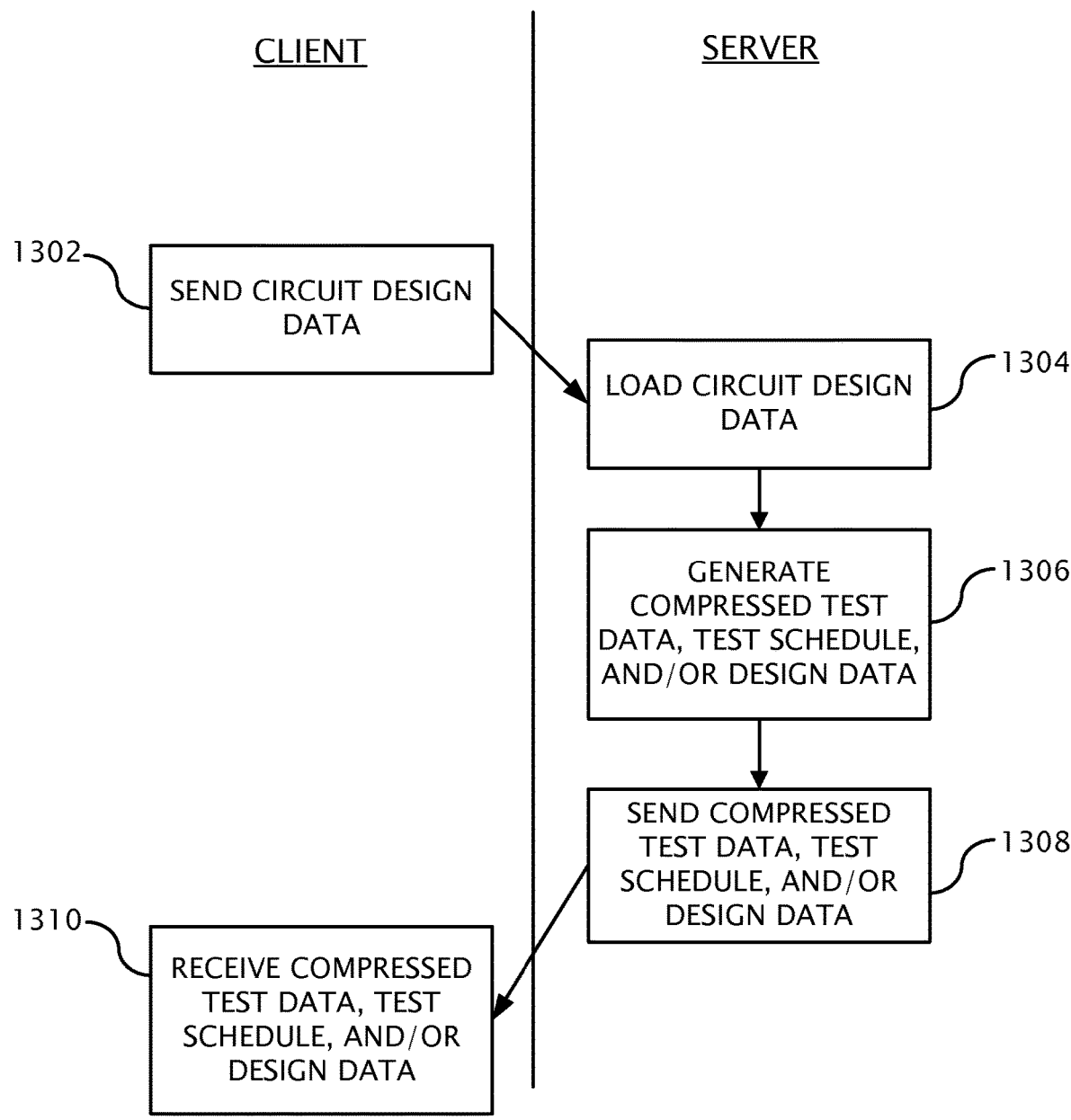
FIG. 13 illustrates a flowchart showing an exemplary method for performing or implementing any of the disclosed embodiments using a distributed computer network (such as the networks of FIGS. 37 and 38).

FIG. 13 shows that design information for a circuit-under-test (for example, an HDL file, netlist, GDSII file, Oasis file, or other suitable design file representing the circuit-under-test together with its scan chains) can be analyzed using a remote server computer (such as the server computer 1100 shown in FIG. 11) or a remote computing environment (such as the computing environment 1200 shown in FIG. 12) in order to generate test pattern, compressed test data, test schedules, or test hardware according to any embodiment of the disclosed technology. At process block 1302, for example, the client computer sends the integrated circuit design information to the remote server or computing environment. In process block 1304, the integrated circuit design information is received and loaded by the remote server or by respective components of the remote computing environment. In process block 1306, test pattern and compressed test data generation, test scheduling, or test hardware generation is performed in order to implement any of the disclosed embodiments. At process block 1308, the remote server or computing environment sends the resulting test patterns, control signals, or design data storing the generated test hardware to the client computer, which receives the data at process block 1310.

It should be apparent to those skilled in the art that the example shown in FIG. 1300 is not the only way to generate test pattern, compressed test data, test schedules, or test hardware using multiple computers. For instance, the CUT design information may be stored on a computer-readable medium that is not on a network and that is sent separately to the server or computing environment (for example, a CD-ROM, DVD, or portable hard drive). Or, the server computer or remote computing environment may perform only a portion of the compressed test data generation, test scheduling, or test hardware generation procedures.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not

What is claimed is:

1. A method, performed by one or more computers, of test scheduling in a test compression environment, the method comprising:
  receiving test information, the test information comprising compressed test data that encode a plurality of test patterns for testing a plurality of cores in an integrated circuit and automatic test equipment (ATE) channel requirements for delivering the compressed test data to the plurality of cores, the test information further comprising correlated core information;
  forming test pattern clusters based on the test information, the test pattern clusters including test patterns selected from the plurality of test patterns, wherein the selected test patterns are delivered to the plurality of cores in the integrated circuit in parallel, wherein forming at least one of the test pattern clusters comprises merging two configuration classes that comprise disjoint subsets of the plurality of cores in the integrated circuit;
  generating ATE channel allocation information for the plurality of cores in the integrated circuit based on the test pattern clusters; and
  designing a test access circuit comprising a rearrangeable interconnection network comprising wires connecting ATE channels to the plurality of cores in the integrated circuit, wherein the test access circuit is configured to:
    use the rearrangeable interconnection network to dynamically allocate the ATE channels to the plurality of cores in the integrated circuit using the ATE channel allocation information generated based on the test pattern clusters, and
    deliver a plurality of the test patterns in a test pattern cluster, of the test pattern clusters, to the plurality of cores in the integrated circuit in parallel via the dynamically allocated ATE channels.

2. The method recited in claim 1, further comprising:
  generating the compressed test data that encode the plurality of test patterns for testing the plurality of cores in the integrated circuit.

3. The method recited in claim 2, wherein the generating the compressed test data comprises deriving solutions for linear equations associated with decompressors for the plurality of cores.

4. The method recited in claim 1, wherein the forming test pattern clusters comprises:
  forming configuration classes of test patterns; and
  combining complementary configuration classes selected from the configuration classes of test patterns to form the test pattern clusters.

5. The method recited in claim 1, wherein the generating ATE channel allocation information for the plurality of cores is further based on core distribution histogram information.

6. The method recited in claim 1, wherein the generating ATE channel allocation information for the plurality of cores employs a best-fit scheme or a balanced fit scheme.

7. The method recited in claim 1, wherein the designing the test access circuit comprises using a scheme to reduce a number of wires connecting one or more of the ATE channels and embedded deterministic test (EDT) inputs for the plurality of cores.

8. The method recited in claim 1, wherein the rearrangeable interconnection network further comprises a control circuitry that controls connections between one or more of the ATE channels and embedded deterministic test EDT inputs of the plurality of cores according to control signals, the control signals being generated based on the ATE channel allocation information.

9. A system, comprising:
  a computer comprising one or more processors and a non-transitory computer-readable medium storing executable instructions that, when executed by the one or more processors, cause the computer to perform operations, comprising:
  receiving test information, the test information comprising compressed test data that encode a plurality of test patterns for testing a plurality of cores in an integrated circuit and automatic test equipment (ATE) channel requirements for delivering the compressed test data to the plurality of cores;
  forming test pattern clusters based on the test information, the test pattern clusters including test patterns selected from the plurality of test patterns, wherein the selected test patterns are delivered to the plurality of cores in the integrated circuit in parallel, wherein forming at least one of the test pattern clusters comprises merging two configuration classes that comprise disjoint subsets of the plurality of cores in the integrated circuit;
  generating ATE channel allocation information for the plurality of cores in the integrated circuit based on the test pattern clusters; and
  designing a test access circuit comprising a rearrangeable interconnection network comprising wires connecting ATE channels to the plurality of cores in the integrated circuit, wherein the test access circuit is configured to:
    use the rearrangeable interconnection network to dynamically allocate the ATE channels to the plurality of cores in the integrated circuit using the ATE channel allocation information generated based on the test pattern clusters, and
    deliver a plurality of the test patterns in a test pattern cluster, of the test pattern clusters, to the plurality of cores in the integrated circuit in parallel.

10. The system recited in claim 9, wherein the test information further comprises correlated core information.

11. The system recited in claim 9, wherein the forming test pattern clusters comprises:
  forming configuration classes of test patterns; and
  combining complementary configuration classes selected from the configuration classes of test patterns to form the test pattern clusters.

12. The system recited in claim 9, wherein the generating ATE channel allocation information for the plurality of cores employs a best-fit scheme or a balanced fit scheme.

13. A non-transitory processor-readable medium storing processor-executable instructions for causing one or more processors to perform a method of test scheduling in test compression environment, comprising:
  receiving test information, the test information comprising compressed test data that encode a plurality of test patterns for testing a plurality of cores in an integrated circuit and automatic test equipment (ATE) channel requirements for delivering the compressed test data to the plurality of cores, the test information further comprising correlated core information;
  forming test pattern clusters based on the test information, the test pattern clusters including test patterns selected from the plurality of test patterns, wherein the selected test patterns are delivered to the plurality of cores in the integrated circuit in parallel, wherein forming at least one of the test pattern clusters comprises merging two configuration classes that comprise disjoint subsets of the plurality of cores in the integrated circuit;

generating ATE channel allocation information for the plurality of cores in the integrated circuit based on the test pattern clusters; and designing a test access circuit comprising a rearrangeable interconnection network comprising wires connecting ATE channels to the plurality of cores in the integrated circuit, wherein the test access circuit is configured to:

use the rearrangeable interconnection network to dynamically allocate ATE channels to the plurality of cores in the integrated circuit using the ATE channel allocation information generated based on the test pattern clusters, and deliver a plurality of test patterns in a test pattern cluster, of the test pattern clusters, to the plurality of cores in the integrated circuit in parallel.

14. The non-transitory processor-readable medium recited in claim 13, wherein the method further comprises:

generating the compressed test data that encode the plurality of test patterns for testing the plurality of cores in the integrated circuit.

15. The non-transitory processor-readable medium recited in claim 14, wherein the generating the compressed test data comprises deriving a solution for a linear equation associated with a decompressor for at least one of the plurality of cores.

16. The non-transitory processor-readable medium recited in claim 13, wherein the forming test pattern clusters comprises:

forming configuration classes of test patterns; and combining complementary configuration classes selected from the configuration classes of test patterns to form the test pattern clusters.

17. The non-transitory processor-readable medium recited in claim 13, wherein the generating ATE channel allocation information for the plurality of cores employs a best-fit scheme or a balanced fit scheme.

18. The non-transitory processor-readable medium recited in claim 13, wherein the rearrangeable interconnection network further comprises a control circuitry that controls connection between ATE channels and EDT (embedded deterministic test) inputs of the plurality of cores according to control signals, the control signals being generated based on the ATE channel allocation information.

* * * * *